United States Patent [19]
Zavracky et al.

[11] Patent Number: 5,656,548
[45] Date of Patent: Aug. 12, 1997

[54] METHOD FOR FORMING THREE DIMENSIONAL PROCESSOR USING TRANSFERRED THIN FILM CIRCUITS

[75] Inventors: Paul M. Zavracky, Norwood; Matthew Zavracky, Attleboro; Duy-Phach Vu, Taunton; Brenda Dingle, Mansfield, all of Mass.

[73] Assignee: Kopin Corporation, Taunton, Mass.

[21] Appl. No.: 531,177

[22] Filed: Sep. 19, 1995

Related U.S. Application Data

[63] Continuation of Ser. No. 130,033, Sep. 30, 1993, abandoned.

[51] Int. Cl.⁶ .................................................. H01L 21/18
[52] U.S. Cl. ............................ 438/23; 148/DIG. 164; 257/700; 257/724; 438/26; 438/109; 438/118; 438/455
[58] Field of Search ................................ 437/208, 205, 437/915, 21; 257/700, 666, 723, 724; 148/164

[56] References Cited

U.S. PATENT DOCUMENTS

| | | | |
|---|---|---|---|
| 3,370,203 | 2/1968 | Kravitz et al. | 437/208 |
| 3,769,702 | 11/1973 | Scarbrough | 437/208 |
| 4,612,083 | 9/1986 | Yasumoto et al. | 437/208 |
| 4,727,047 | 2/1988 | Bozler et al. | 437/89 |
| 4,748,485 | 5/1988 | Vasudev | 357/23.7 |
| 4,847,146 | 7/1989 | Yeh et al. | 428/332 |
| 4,897,708 | 1/1990 | Clements | 357/65 |
| 4,980,034 | 12/1990 | Volfson et al. | 204/38.4 |
| 5,013,687 | 5/1991 | Solomon | 437/208 |
| 5,094,969 | 3/1992 | Warren | 437/208 |
| 5,107,586 | 4/1992 | Eichelberger et al. | 437/208 |
| 5,122,475 | 6/1992 | Heckaman et al. | 437/208 |
| 5,128,737 | 7/1992 | van der Have | 357/40 |
| 5,138,437 | 8/1992 | Kumamoto et al. | 357/75 |
| 5,202,754 | 4/1993 | Bertin et al. | 257/723 |
| 5,206,749 | 4/1993 | Zavracky et al. | 359/59 |
| 5,212,778 | 5/1993 | Dally et al. | 395/400 |
| 5,227,338 | 7/1993 | Kryzaniwsky | 437/208 |
| 5,256,562 | 10/1993 | Vu et al. | 437/86 |
| 5,258,325 | 11/1993 | Spitzer et al. | 437/86 |
| 5,262,351 | 11/1993 | Bureau et al. | 437/208 |
| 5,280,192 | 1/1994 | Kryzaniwsky | 257/723 |
| 5,300,788 | 4/1994 | Fan et al. | 257/13 |
| 5,324,980 | 6/1994 | Kusunoki | 257/723 |
| 5,347,154 | 9/1994 | Takahashi et al. | 257/347 |
| 5,354,695 | 10/1994 | Leedy | 437/7 |
| 5,373,189 | 12/1994 | Massit et al. | 257/723 |
| 5,376,561 | 12/1994 | Vu et al. | 437/31 |
| 5,407,511 | 4/1995 | Nakatani et al. | 156/230 |

FOREIGN PATENT DOCUMENTS

| | | |
|---|---|---|
| 316 799 | 5/1989 | European Pat. Off. . |
| 0 474 474 A3 | 3/1992 | European Pat. Off. . |
| 0 486 318 A1 | 5/1992 | European Pat. Off. . |
| 0 486 829 A2 | 5/1992 | European Pat. Off. . |
| 0 517 369 A2 | 12/1992 | European Pat. Off. . |
| 468 080 | 3/1968 | Germany . |
| 4240762 | 8/1992 | Japan . |
| 92/13363 | 8/1992 | WIPO . |
| 93/16491 | 8/1993 | WIPO . |

OTHER PUBLICATIONS

R.W. Johnson, et al., "Multichip Modules—Systems Advantages, Major Constructions, and Materials Technologies," *IEEE Press, The Institute of Electrical and Electronics Engineers, Inc.*, pp. 150–155 (1991).

Sasaki, "Feasibility of 3D Intergration" *ETT* 1(2):55–60 (Mar./Apr. 1990).

(List continued on next page.)

*Primary Examiner*—John Niebling
*Assistant Examiner*—Long Pham
*Attorney, Agent, or Firm*—Hamilton, Brook, Smith & Reynolds, P.C.

[57] ABSTRACT

A multi-layered structure is fabricated in which a microprocessor is configured in different layers and interconnected vertically through insulating layers which separate each circuit layer of the structure. Each circuit layer can be fabricated in a separate wafer or thin film material and then transferred onto the layered structure and interconnected.

63 Claims, 17 Drawing Sheets

OTHER PUBLICATIONS

Gotzlich, "Technology and Devices Fro Silicon Based Three-Dimensional Circuits" pp. 1–35 (1989).

Neudeck, "Three-Dimensional CMOS Integration" *Circuites and Devices* pp. 32–38 (Sep. 1990).

Hayashi et al., "A New Three Dimensional IC Fabrication Technology, Stacking Thin Film Dual-CMOS Layers" *IEDM* pp. 657–660 (1991).

"Industry News" *Miconductor Int'l* one page (Dec. 1991).

Kawasura et al., "3-D High-Voltage CMOS ICS By Recrystallized SOI Merged With bulk Control-Unit" *IEDM* pp. 758–761 (1987).

Dunne et al., "Materials and Devices Toward Three-Dimensional Integration" *Microelec. Eng.* 8 (1988) pp. 235–253.

Yamazaki et al., "4-Layer 3-D IC Technologies For Parallel Signal Processing" *IDEM* pp. 599–602 (1990).

Kopin Corp. et al. "3D Circuits Formed By Film Transfer Techniques" *DARPA BAA 92–18 Proposal* pp. 1–50 (Jul. 31, 1992).

Nishimura et al., "Three Dimensional IC For High Performance Image Signal Processor" *IEDM* pp. 111–114 (1987).

Ulf Kong, "Draft Designs For Multifunctional IC's Three Dimensional Integration" *Elektroniker* No. 10/1989; pp. 79–82 (with translation).

Ernst Hofmeister, "Microelectronics 2000" *TRENDS* (1989); pp. 1–16 (with translation).

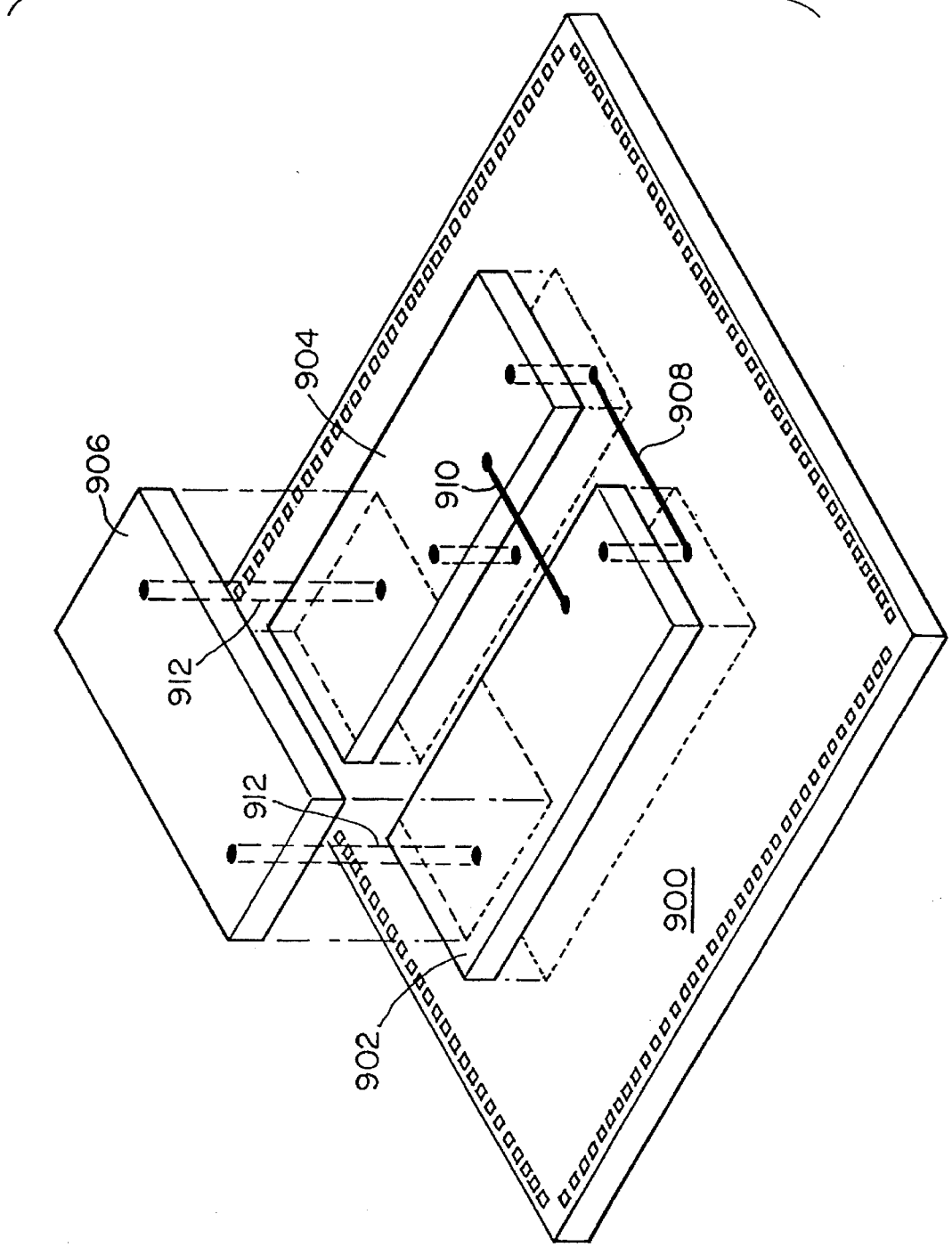

METHOD FOR FORMING THREE DIMENSIONAL PROCESSOR USING TRANSFERRED THIN FILM CIRCUITS

RELATED APPLICATION

This application is a continuation of application Ser. No. 08/130,033 filed on Sep. 30, 1993, now abandoned which is incorporated herein by reference in its entirety.

BACKGROUND OF THE INVENTION

Typically, processors are constructed from a variety of very large scale integrated circuit (VLSI) chips used as building blocks in an architecture which can be divided into two components; an instruction processor that supervises the order and decoding of instructions to be executed, and a data processor which performs the operations called for by the instructions on the data. These components are often two different chips mounted on a circuit board, or can be fabricated on a single chip in two dimensional geometry. The instruction processor normally includes a program memory which contains instructions. Each instruction includes a plurality of bits to control the elements within the data processor. In addition, the controller is used to issue addresses that are applied to the program memory to access the instruction sequence to be executed. It is desirable to execute these instructions as fast as possible, preferably in one clock cycle or less. However, due to the geometry of laying out the microprocessor using existing methods, the difficulties in increasing speed also increase the cost and complexity of manufacturing.

Data processors have been categorized as either an 8, 16 or 32-bit device. They are capable of performing arithmetic or logic operations on 8, 16, or 32 bits, respectively. Some processors have limited ability to perform operations on a full-sized word. For example, a 16-bit data processor may be able to perform operations on the least-significant byte (8 bits) of a full-sized 16-bit word. In one such approach, a 16-bit processor is formed from a parallel combination of four-bit processors. This approach is typically referred to as the "bit-sliced" technique.

This method entails extensive parallel interconnection of the terminal pins of the data processor chips. Additionally, space, is at a premium on the printed circuit board used to mount the microprocessor chips and is consumed by the data processor chips and the busses used to connect the chips.

While previous 8- and 16-bit data processors have been available using bipolar semiconductor fabrication techniques, 32-bit data processors have used a slower metal oxide silicon fabrication procedure. Also contributing to speed degradation, previous processors used a single multiplexed input/output bus, which typically imposed limits on input and output operation.

The components of each chip are typically made from thousands of transistors and inverters. These elements are used to form gate arrays, shift registers, memories and other components. The speed of operation of the data processor, and therefore the microprocessor itself, depends in large part on the architecture of its internal circuitry. Throughput (the time it takes for an instruction to be executed) depends, in part, upon the number of gates data must pass through during its processing. Also, operating speed can be increased by combining several operations into one instruction. A continuing need exists however to provide hardware capable of faster throughput Where a larger number of instructions can be executed within the cycle time of the device and at the same time provide such a structure in a smaller space that is dependable, relatively inexpensive and is constructed using the simplest fabrication procedure possible.

SUMMARY OF THE INVENTION

The present invention relates to the structure and fabrication of very large scale integrated circuits, and in particular, to vertically stacked and interconnected circuit elements for data processing, control systems, and programmable computing. A preferred embodiment involves a microprocessor divided into functional blocks, for instance, an Arithmetic Logic Unit (ALU), a controller, memory elements etc., which are fabricated in the same or separate semiconductor wafers and then stacked. Typically, the functional blocks communicate with one another using address, data and control busses. These busses consist of a number of metal wires that are normally routed along the surface of a silicon chip. Typically, the metal wires run in areas of the chip between the functional blocks and take up a considerable amount of real estate, perhaps as much as half that available. In the present invention the functional blocks of the circuit are divided into two or more sections with one section of the circuit on a bulk chip and the remaining blocks on an overlying thin film with components electrically connected through an intervening insulating layer.

Both bulk and thin film semiconductor layers can be incorporated into preferred embodiments of the invention. Circuits can be formed in bulk silicon, silicon-on-insulator (SOI) structures, or in III–V materials such as gallium arsenide, or in composite structures including bulk Si, SOI, and/or thin film GaAs. The various layers of the device can be stacked using an insulating layer that bonds the layers together and conductive interconnects or vertical busses extending through the insulating layer which preferably comprises a polymeric material such as an adhesive. Thermal and electrical shielding can be employed between adjacent circuit layers to reduce or prevent thermal degradation or cross-talk.

Wire bond pads on the bulk chip or on the thin film layers of the structure are required for communicating with the package the chips will be placed in such as a leadless chip carrier. These pads need to be large enough that wires can be bonded to them. Interconnection pads are used to connect the different layers of the circuit together. These pads can be considerably smaller than the wire bond pads because the method of interconnection will, in a preferred embodiment, be through metal deposition. Complementary pairs of interconnection pads are used on the bulk and SOI chips. Instead of running busses along the surface of the wafer, many of these run in a vertical direction (the third dimension) between functional blocks freeing up significant real estate for active circuitry.

In a preferred embodiment, after fabricating the different layers of the circuit, the SOI circuit layers can be transferred to the bulk silicon chip. The transfer is conducted using an electrically insulating adhesive layer between the bulk and SOI chips to secure the two circuit layers together and at the same time maintain the electrical isolation required. In addition, in an embodiment using a single transfer process the isolation oxide layer of the SOI material is the upper most layer on the combined chip. This completely isolates the active circuitry from the surface of the wafer, allowing routing of metal wires across the surface. Since an interconnection metal layer completes the circuit, this same metal layer is used for busses without losing valuable circuit space on each layer. To perform the interconnection, vias are cut down to the interconnection pads on the bulk chip or underlying thin film semiconductor circuit layer. Metal deposition is used to connect the lower and upper functional blocks.

Some of the advantages of this three dimensional approach include higher speed and packing density. The speed increases result from at least two areas; the first is the reduction in the length of the busses. On chip circuit speed is limited to some extent by the length of the wires carrying signals around the chip. All wires on the chip have associated capacitances and inductances. Typical treatment of wire lead delays follows from simple transmission line analysis. The longer the leads, the longer the associated delays. In the proposed approach, shorter busses will result in smaller delays and higher speed circuit performance.

The second source of speed improvement is obtained from the SOI itself. The circuit is divided into two halves or into three or more layers in other embodiments. In one embodiment, the first half is a bulk circuit. However, this silicon circuitry can be entirely replaced on SOI.

Improvement in operating speed for SOI circuitry originates from three areas. Perhaps the largest speed enhancement results from the fact the circuit is isolated from the bulk silicon wafer by a thick oxide layer. This reduces individual device capacitance as well as the capacitance associated with the metal and substrate. A second reduction in capacitance is achieved due to a reduction in the exposed source and drain areas common in CMOS circuit components. This is a result of the fact that in SOI, the source/drain implantations are terminated by the oxide layer. This eliminates a large portion of the capacitance associated with the source/drain to well junctions. The final increase in speed has been reported using thin film SOI devices. These are fabricated in silicon layers having thickness in the range of 0.1–10 µm and preferably in 1.0 µm or less of silicon. As indicated previously the bulk or thin film layers of semiconductor material can also utilize III–V materials such as GaAs made using standard chemical vapor deposition process.

Increases in packing density come from two sources. The three dimensional approach allows stacking fractions of the circuit on top of one another. The two layer stack without any other modification already consumes half the area of the standard 2 D circuit. A second increase is available due to the reduction of area needed to route the busses over the chip. This will again halve the area of the combined circuit leading to a minimum packing density decrease of 4 times.

In one embodiment blocks requiring higher speeds are fabricated in the SOI for instance. A second alterative is to divide the microprocessor into four bit processors that are combined in two layers to create an 8 bit microprocessor or in four layers to create a 16 bit microprocessor. The embodiments employ various interconnection pad configurations. In one embodiment, for instance, the pads on the upper and lower circuits are offset slightly. This allows individual vias to be etched down to each. Deposited metal then interconnects the two pads. Alignment tolerances determine the pad size needed.

In one embodiment test devices are included in the SOI mask set. These allow probing individual devices to determine their performance. The test chip includes small test circuits which provide information on circuit performance parameters such as ring oscillators and gate delay chains. An extra metal layer can be used in order to route the small interconnection pads out to larger pads for testing.

Having completed and tested each of the circuit layers which make up the complete microprocessor, the SOI circuit is transferred to the bulk wafer. A key aspect of the transfer process is that the two or more circuit layers must be aligned to one another. A second aspect of this task is that once combined the circuit halves are integrated. This is performed by etching via holes down to the appropriate interconnection pads, depositing aluminum and patterning the aluminum to create interconnection between the circuits and any routing that may be required.

In embodiments employing more than two layers, interconnections can be performed after transfer of each successive layer or after two or more layers. Such connections can be optical or electrical, and can run externally or through the bonding layers connecting each layer. Connections can also be made between circuit elements on the same layer or different layers using a circuit routing layer. The circuit routing layer can also have circuitry thereon or can be made of an electrical or thermal insulating material such as ceramic or silicon carbide. The circuit routing layer has metalization lines or busses formed on one or both sides. In non-active regions the circuit routing layer can be patterned on one or both sides with a metal that can be connected to ground for further insulation between layers.

A double transfer process can also be used in which a thin film has circuits fabricated followed by transfer onto a second disposable or reusable substrate, back processing of the circuit layer as needed and then transfer onto the stacked structure and interconnecting metalization. Tiling of transferred thin film circuits on each layer of the device can also be employed. These transfer and tiling methods can be used to incorporate optoelectronic components including light emitting diodes (LEDs) and displays into the three dimensional structure.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 15 is an exploded perspective view of multi-layer tiling technique.

DETAILED DESCRIPTION OF THE PREFERRED EMBODIMENT

Figure 1:
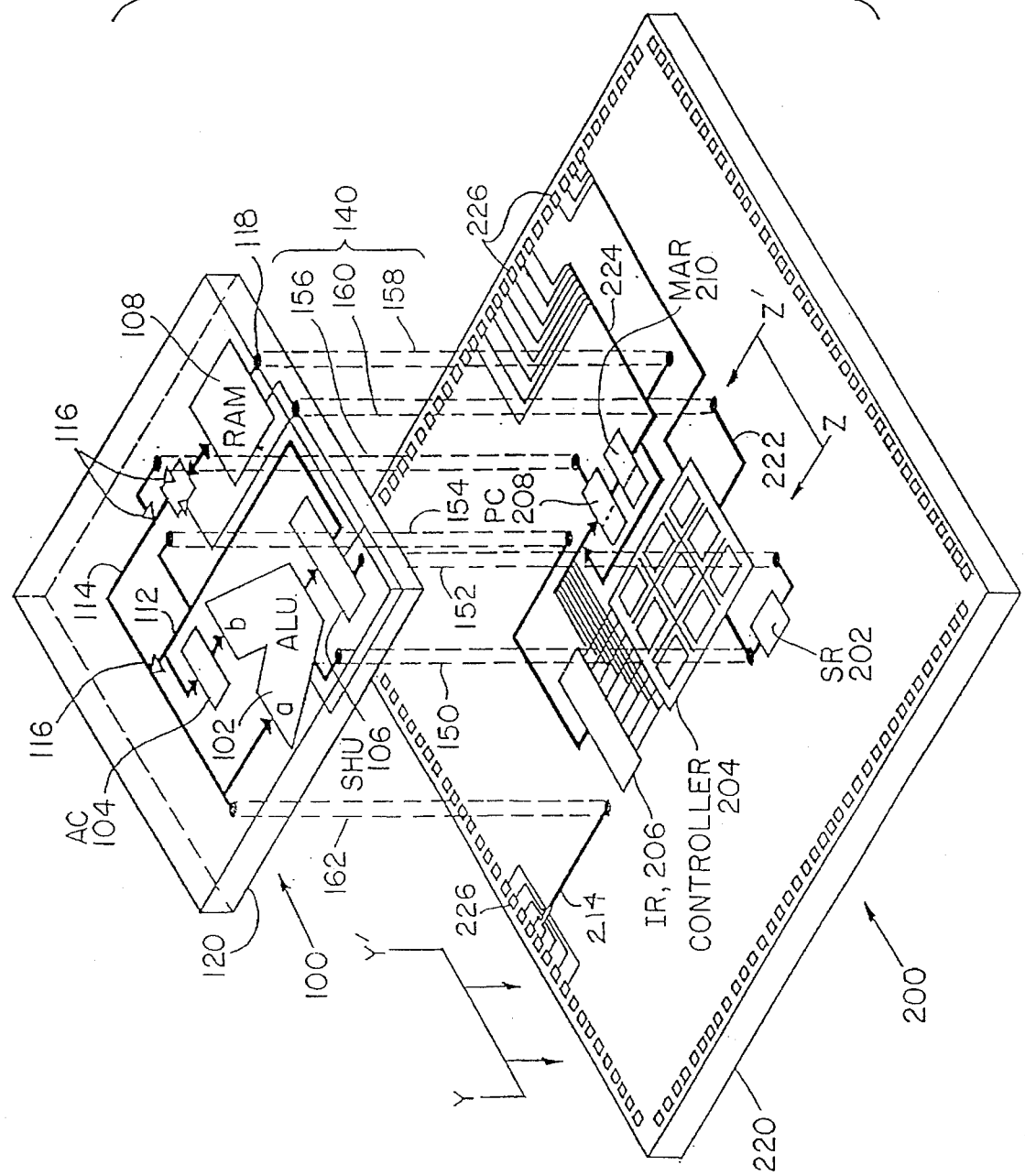
FIG. 1 is an exploded schematic illustration of a multi-layer microprocessor embodying the present invention.

An exploded schematic illustration of the preferred embodiment for the present invention is shown in FIG. 1. The basic components of a multi-layered microprocessor are fabricated upon a first layer 200 and second layer 100. The first layer 200 comprises a silicon substrate 220, upon which is fabricated microprocessor logic blocks, interconnect lines, and bonding pads. The second layer 100, comprises a thin film 120, upon which is fabricated microprocessor logic blocks and interconnect lines. The first layer 200 is areally larger than the second 100, to provide for access to the bonding pads 226.

A standard microprocessor is comprised of several logic units: controller 204, status register 202, program counter register 208, memory address register 210, instruction register 206, arithmetic logic unit 102, accumulator register 104, shift register 106, random access memory 108. Interconnect paths such as a data bus 114, an address bus 224, and various control lines 222, provide communication between logic units or between a logic unit and off-chip resources. Paths which connect off-chip are routed to bonding pads 226, which are wire-bonded to the chip carrier pins. Paths which are common to several logic units, such as the data bus 114, require bus arbitration logic to connect and remove individual logic units to and from the common data bus 114. The arbitration logic, hosted in the controller 204, activates and deactivates various buffers 116 in accordance with bus arbitration protocol.

A typical microprocessor is programmed through the use of software. Software is a series of logical instructions encoded by a compiler into a format which the controller 204 understands. After the microprocessor is reset, software is downloaded into internal random access memory 108, or off-chip random access memory. Alternatively, the software may be supplied by a pre-programmed read only memory.

Initially, the program counter register 208 contains the address of the instruction to be fetched. The address is moved from the program counter register 208 to the memory address register 210 and the program counter register 208 is incremented. After clocking the contents of the memory address register 210 onto the address bus 224, the controller 204 asserts a memory read signal, which places the data word stored in memory to be available on the data bus 114. The controller 204 activates the appropriate control signals so that the data word is passed through the 'a' side of the arithmetic logic unit 102, through the shift register 106, and into the instruction register 206.

Control decisions are made based upon the contents of the instruction register 206. For example, an instruction could command the controller 204 to add the contents of the accumulator register 104 to the contents of a particular location in random access memory 108, and to store the result in the accumulator register 104. The controller 204 would first address that location in random access memory 108, clocking its contents onto the data bus 114. The controller 204 would then have the arithmetic logic unit 102 add the word on the data bus with the contents of the accumulator register 104. The result would be clocked out of the shift register 106 and stored back in the accumulator register 104. If the result was a negative number or zero, the controller 204 would set the appropriate status bit in the status register 202.

The embodiment depicted in FIG. 1 presents one of many possibilities for partitioning the microprocessor functions onto several layers. The first layer 200 includes a controller 204, instruction register 206, status register 202, program counter register 208, and memory address register 210. The data bus 214, address bus 224 and various discrete signals including control lines 222, clocks, communication ports, and power and ground lines are routed to the bonding pads 226 for off-chip access. The second layer 100 includes an arithmetic logic unit 102, accumulator register 104, shift register 106, random access memory 108, and buffers 116. Interconnect lines, which include a data bus 114, an address bus 118, a shift register output bus 112, and various control signals provide interconnect between second layer 100 logic units.

Inter-layer connections 140 provide for vertical communication between logic units on the first 200 and second 100 layers. Such connections can be placed anywhere on the die and therefore are not limited to placement on the outer periphery. They are used for the same reasons any lines otherwise restricted to a single layer are used, including clock distribution, discrete control signals, power and ground supplies, and the like.

The preferred embodiment shows inter-layer connectors being used in various applications. The data bus 114 is connected 162 down to the first layer 214 so that it may be routed to the bonding pads 226. The status register 202 is on the first layer 200, but receives updates from the shift register 106 on the second layer 100 via an inter-layer connector 152. The arithmetic logic unit 102, on the second layer 100, receives status words from the status register 202 over a inter-layer connector 150. The controller 204 supplies various control signals, clock signals and memory read/write signals to the second layer by inter-layer connector 160. The address bus 224 and shift register output bus 112 are distributed to both layers through the use of inter-layer connectors 154 and 158 respectively.

Figure 2:
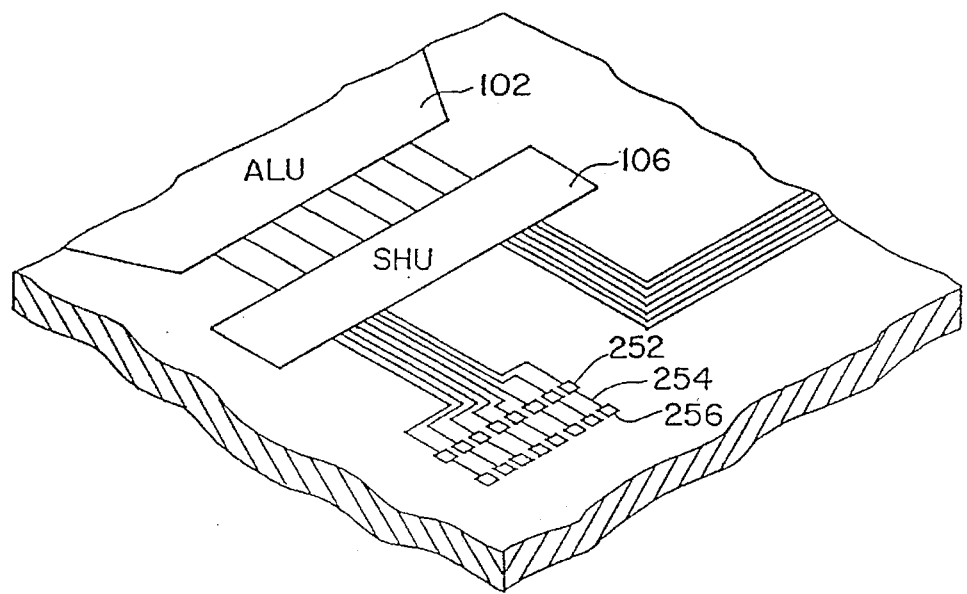
FIG. 2 illustrates an inter-layer connector as seen from the top-view of an upper layer.

The size of the inter-layer connectors 140 is quite small, relative to the size of the bonding pads 226. Not much larger than the minimum feature size, the connector facilitates inter-layer communication without reserving much real estate on the die. An inter-layer connector is illustrated schematically in FIG. 2. Each shift register output is routed to a metal terminal 252. A hole 256 is routed through the second layer exposing a metal path on the first layer. A metal layer 254, is implanted in the hole, providing electrical contact between the terminal 252 on the second crystalline layer and the exposed metal path on the first layer. Inter-layer connection is achieved with a minimal loss of die space.

FIGS. 3A–3H illustrate an Isolated Silicon Epitaxy (ISE) process, used to form silicon-on-insulator (SOI) films in which the microprocessor circuitry is fabricated. Note that any number of techniques can be employed to provide a thin film of single crystal silicon. An SOI structure, such as that shown in FIG. 3A, includes a substrate 300 and an insulator 302 (for example silicon dioxide) that is grown or deposited on the substrate 300. A thin single layer crystalline of silicon 304 is formed over the insulator 302. The insulator 302 is thus buried beneath the silicon surface layer. For the case of ISE SOI structures, the top layer is a substantially single-crystal silicon, from which CMOS circuits can be fabricated. The use of a buried insulator provides devices having higher speeds than can be obtained in conventional bulk material. Circuits containing in excess of 1.5 million CMOS transistors have been successfully fabricated in ISE material.

Figure 3A:
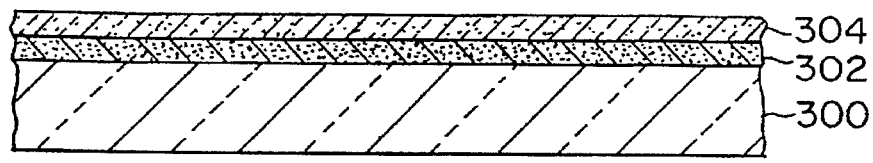
FIGS. 3A–3H is a preferred process flow sequence illustrating the fabrication of a transistor used in the preferred embodiment.
Figure 3B:
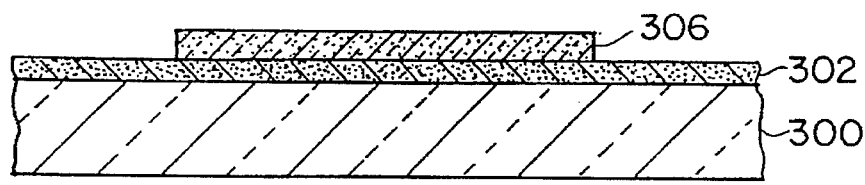
Figure 3C:
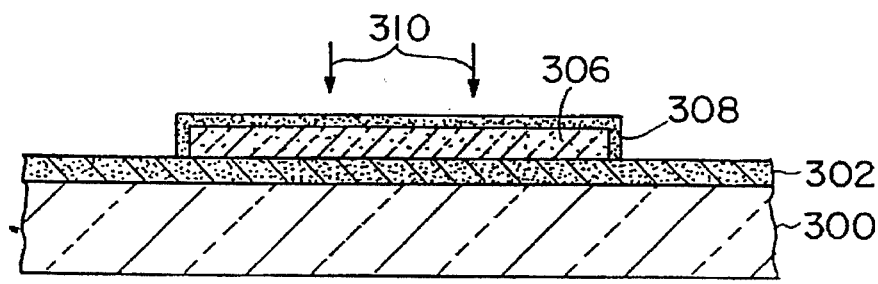

As shown in FIG. 3B, the silicon layer is patterned to define a transistor region 306. A silicon dioxide layer 308 is then formed over the transistor region 306 as shown in FIG. 3C. The transistor region 306 is then implanted 310 with boron or other p-type dopant to provide an n-channel device (or, alternatively, an n-type dopant for a p-channel device).

Figure 3D:
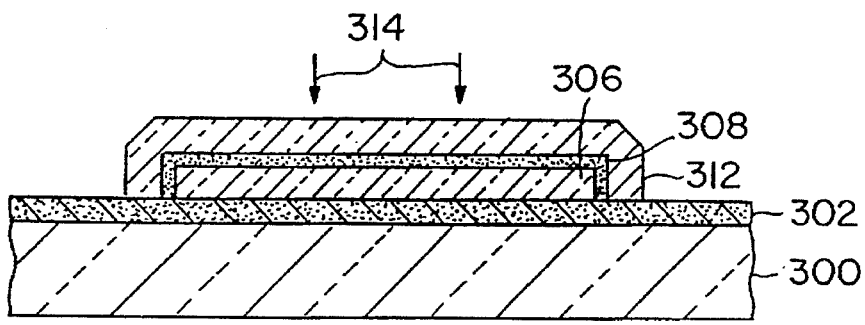
Figure 3E:
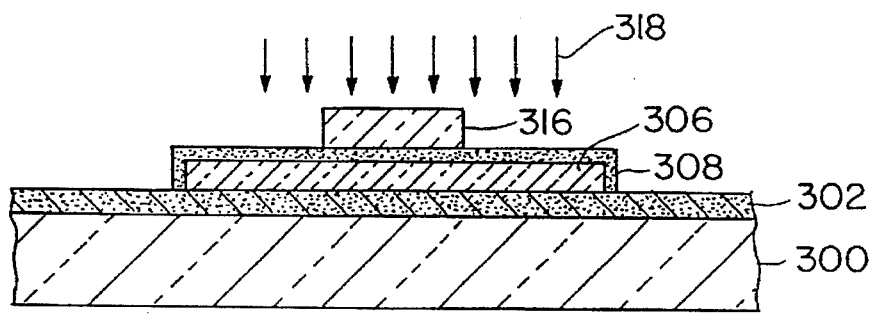
Figure 3F:
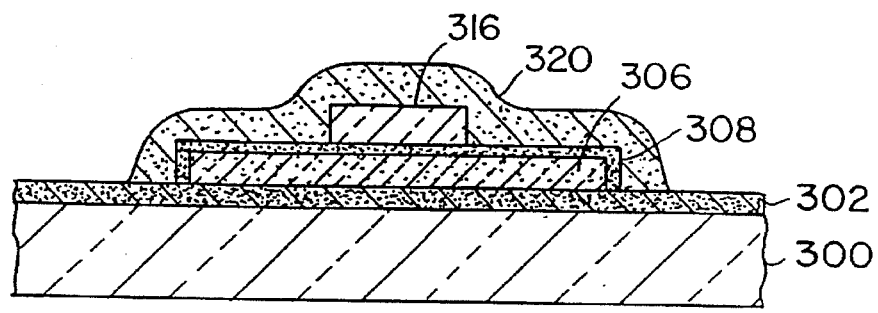
Figure 3G:
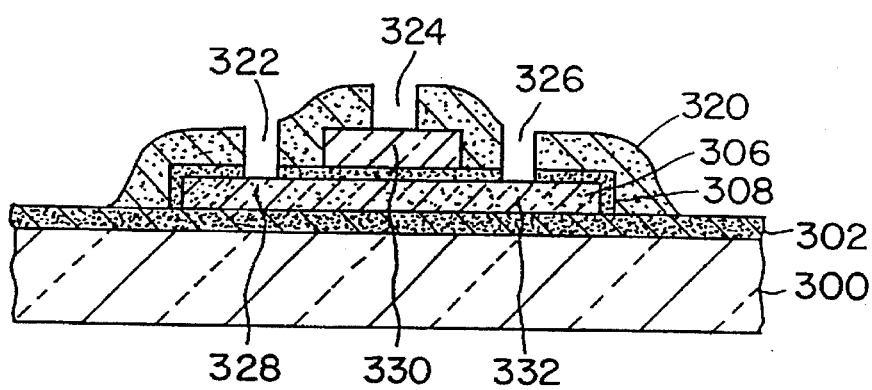
Figure 3H:
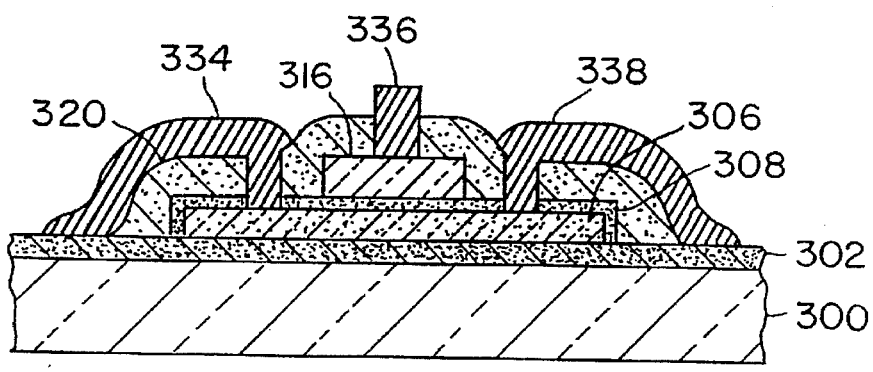

A polycrystalline silicon layer 312, is then deposited over the transistor region 306, as shown in FIG. 3D, and the layer 312, is then implanted 314 with an n-type dopant to lower the resistivity of the layer 312, so that it can be used as a transistor gate. The implanted polycrystalline silicon layer 312 is then patterned to form a transistor gate 316 as seen in FIG. 3E. This is followed by a heavy implant 318 of an n-type dopant to provide source and drain regions for the transistor. As shown in FIG. 3F, silicon dioxide 320 is formed over the transistor, and openings 322, 324, 326 are formed through the silicon dioxide 320 to expose the source 328, the gate 330 and the drain 332, respectively FIG. 3G. In FIG. 3H, a patterned metallization of aluminum, tungsten, or other suitable metal 334, 336, 338 electrically connects the source 328, gate 330, and drain 332 to other circuit components.

Another substrate release process has been developed to form thin (0.1 to 5 micron) films of processed silicon bonded to glass. These films contain active semiconductor devices such as FETs that are partially or completely fabricated prior to transfer. The crystallization and release procedures including the cleavage of laterally grown epitaxial films for transfer (CLEFT) approach are described more fully in U.S. Pat No. 4,727,047 incorporated herein by reference. The chemical epitaxial liftoff (CEL) approach is described more fully in U.S. Pat. Nos. 4,846,931 and 4,883,561 both incorporated herein by reference. Both the CLEFT and CEL techniques permit the reuse of the substrate, leading to reduced cost compared to other approaches in which the substrates are consumed. By combining thin film release techniques with SOI wafers, high quality films and circuits can be formed on glass.

Note that in FIG. 1, the fabricated components and interconnects on the second layer film 100 face the first layer 200 and the components, interconnects and bonding pads on the first layer 200 are above the substrate 220, facing the second layer 100. This example presents the single transfer process method of multi-layered fabrication.

Figure 4A:
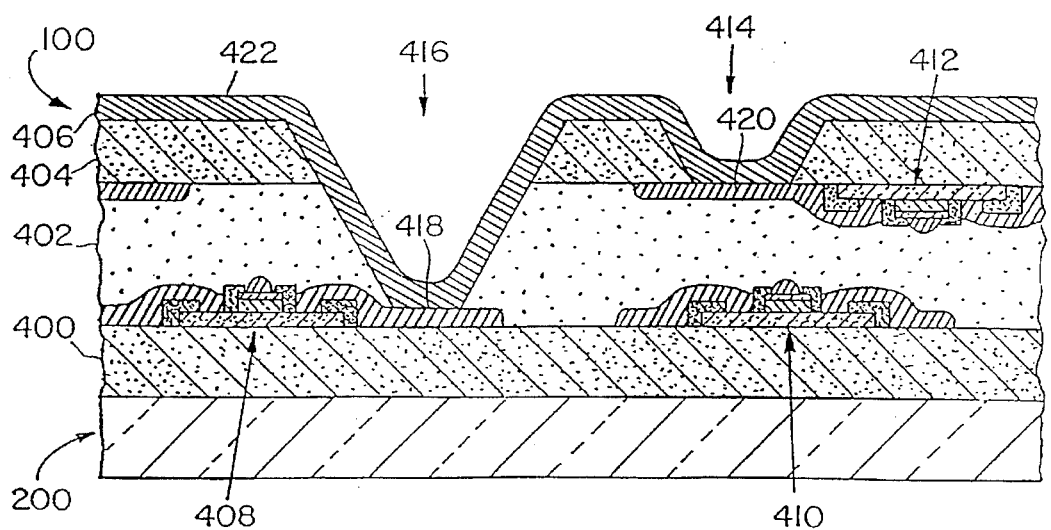
FIG. 4A is a cross-sectional view of an inter-layer connector which is fabricated using a single transfer process.

In the single transfer process, the thin film transistors of adjacent layers face each other. A detailed cross-sectional view of a circuit layered by use of the single transfer process is presented in FIG. 4A. The substrate for the first layer 200 supports an insulating layer 400, upon which is fabricated logic blocks comprising a plurality of transistors 408, 410. The second layer 100 may be separated from its substrate by the method described more fully in U.S. Pat. No. 5,206,749 incorporated herein by reference, or by the CLEFT and CEL approaches cited previously. Supported by its thin silicon dioxide layer 404, the second layer 100 is turned so that its transistors 412 face the transistors 408, 410 of the first layer 200. It is then aligned for proper placement and affixed to the first layer 200 with a heat conducting, electrically insulating epoxy 402, for example, diamond impregnated epoxy.

After the epoxy has cured, a hole 416 is etched through the silicon dioxide 404 of the second layer 100 and through the epoxy 402, exposing the metal pad 418 of the first layer 200 transistor 408. A second hole 414 is etched through the silicon dioxide 404 of the second layer 100 exposing the metal pad 420 of the second layer 100 transistor 412. It is important to note that the holes 414, 416 are much less deep than they are wide, as the layers are much closer together than could be represented in the drawings.

After the holes are etched, a metallization layer 422 is applied to connect the exposed metal pads 418, 420. Not limited to inter-layer connections, the metallization layer 422 may also be used as an available interconnect routing plane, for interconnecting logic blocks on the same layer. A path could be routed up to the metallization layer 422 from the first or second layer, routed across the metallization layer and routed back down to the first or second layer, respectively. This additional layer allows for more complicated routing functions, while reducing the die size needed, resulting in denser, more efficient use of silicon space.

A wafer, or individual tiles diced from the wafer, is attached to a superstrate transfer body as described in greater in U.S. Ser. No. 07/874,588 filed on Apr. 24, 1992 now U.S. Pat. No. 5,376,561 which is incorporated herein by reference. The transfer body can be a glass or other transparent insulator, using an adhesive. Preferably the adhesive is comprised of an epoxy, such as Epotek 377, or a cycloaliphatic anhydride; for example, EP-112 made by Masterbond Inc. It is desirable that the adhesive have the following characteristics:

Good adhesion to glass, oxides, metals, nitrides;

No reactions with glass, metals, oxides, nitrides;

Low shrinkage;

Low warp/stress;

Able to tolerate acids at 100 C for extended periods without lifting, losing adhesion, or degrading;

Able to withstand at least 180° C. for 2 hours without degradation and withstand 165° for 48 hours without degradation;

change;

Good resistance to acids and solvents;

Able to tolerate dicing and heating steps (including an acid etch step with no lifting);

Low viscosity to allow thin adhesive films; and

Ability to be vacuum degassed to eliminate all bubbles.

In general, the cycloaliphatic anhydrides meet all of the above criteria. The epoxy preferably has a low cure temperature to minimize stress from thermal expansion MIS match, a very low ion content (<5 ppm) and low shrinkage.

The wafer, or tile, is attached, using the adhesive, to a glass superstrate. For example EP 112 is an adhesive, that is vacuum degassed to eliminate all bubbles. This sandwich structure is then cured at a low temperature of about 130° C.–130° C. for 4–8 hours which causes the adhesive to gel and minimizes the thermal mismatch characteristics. Then the adhesive is fully cured at a higher temperature of about 160° C. for about 8 hours. This cure assures that the bonds are fully matured. Without this cure, the adhesive will not stand up to any required subsequent acid etching step.

The wafer, or tile, is then cleaned and the native oxide 118 is etched off the back surface. The wafer is put into a solution (KOH or equivalent) of 25 grams to 75 ml $H_2O$ at 100° C. Depending on the thickness of the wafer, it may take up to 4 hours to etch the silicon substrate. The solution etches silicon very rapidly, i.e. 2 to 3 microns/min., and uniformly. The acid has a very low etch rate on oxide, so that as the substrate is etched away and the buried oxide is exposed, the etching rate goes down. The selectivity of the silicon etch rate in KOH versus the oxide etch rate in KOH is very high (200:1). This selectivity, combined with the uniformity of the silicon etching, allows the observer to monitor the process and to stop the etch in the buried oxide layer without punching through to the thin silicon layer above it. Wafers up to 25 mils thick and oxides as thin as 4000 Å have been successfully etched using this process. Some alternative etchants are hydrazine, which has a much higher etch rate selectivity or ethylene diamine pyrocatacol (EDP), or tetra methyl ammonium hudroxide.

When the silicon is completely gone, the vigorous bubbling, which is characteristic of silicon etching in KOH, abruptly stops, signalling that the etching is complete.

The thin films transferred to the respective glass superstrates are now rinsed and dried. If not already provided with circuits the films can be backside circuit processed, if desired, since the epoxy adhesive has very good resistance to chemicals. In addition, the epoxy is very low in residual stress, so that the thin film is very flat and can go through conventional photolithography steps.

After all the necessary circuits are formed, as above, on transfer bodies, they may now be diced and tiled onto a common module body to perform a combined function, such as a microprocessor.

After all the circuits are registered and adhered to the module body, the superstrate is removed using a suitable etchant.

Interconnection of circuits is achieved during registration with solder bumps that extend through the adhesive or by direct laser writing or by metallization and photolithography, or as described elsewhere herein where necessary.

Figure 4B:
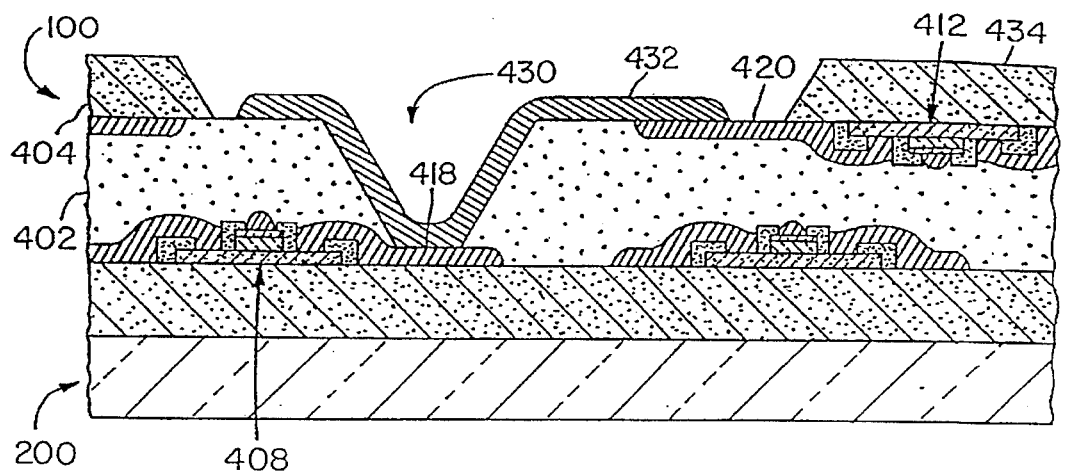
FIG. 4B is a cross-sectional view of an inter-layer connector which is fabricated using the preferred single transfer process.

A preferred embodiment of the single transfer method is presented in FIG. 4B. Again, as in FIG. 4A, in a single transfer process, adjacent layers 200, 100 are aligned so that their transistors 408, 412 face each other. The layers are again affixed with heat conducting, electrically insulating epoxy. The silicon dioxide 434 on the second layer is cut, exposing the second layer 100 transistor 412 metal pad 420 and the epoxy area covering the first layer 200 metal pad 418. A hole 430 is etched through the cured epoxy layer 402 exposing the metal pad 418. A metallization layer 432 is used to electrically connect the exposed metal pads 418, 420. This method reduces the patterning complexity, and shortens the length of the metal line in comparison to the method described by FIG. 4A. In some applications, the FIG. 4A method could be used to insulate the metal layer from components.

Figure 4C:
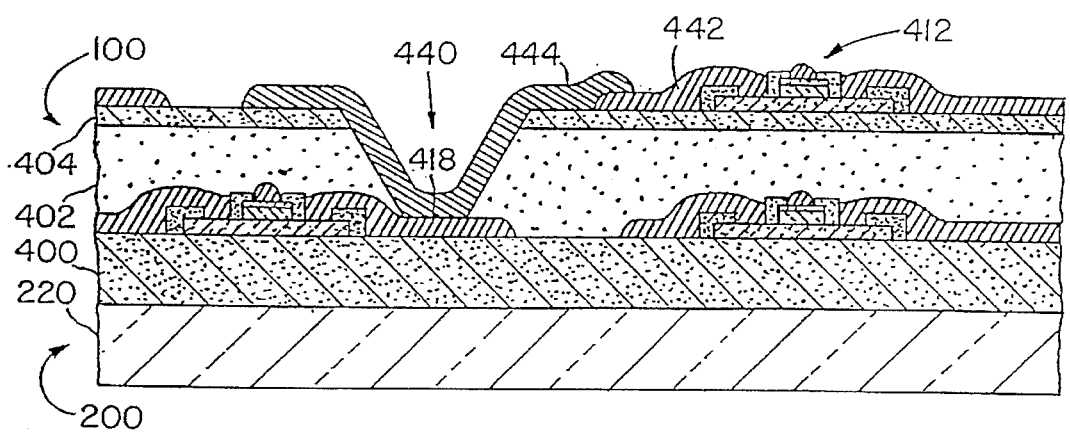
FIG. 4C is a cross-sectional view of an inter-layer connector which is fabricated using the double transfer process.

Another method of layering involves a two-step process referred to as double transfer. As shown in FIG. 4C, in a double transfer process the layers are aligned so that their transistors are stacked, rather than facing each other as in the single transfer method.

In a double transfer process, the first layer 200 is supported by its substrate 220 and silicon dioxide layers 400. The second layer 100 is fabricated, and its substrate is removed by one of the processes discussed above; for example: CLEFT, CEL. After alignment of the first and second layer films, the epoxy 402 is applied and allowed to cure. After registration and bonding to the module body, the transfer body is removed by a suitable etchant. A hole 440 is etched through the second layer silicon dioxide 404, through the epoxy 402, exposing the metal pad 418 on the first layer 200. The metal pad 442 for the second layer 100 transistor 412 is already exposed. A metallization layer 444 is patterned to provide electrical contact between the exposed metal pads 418, 442.

Figure 4D:
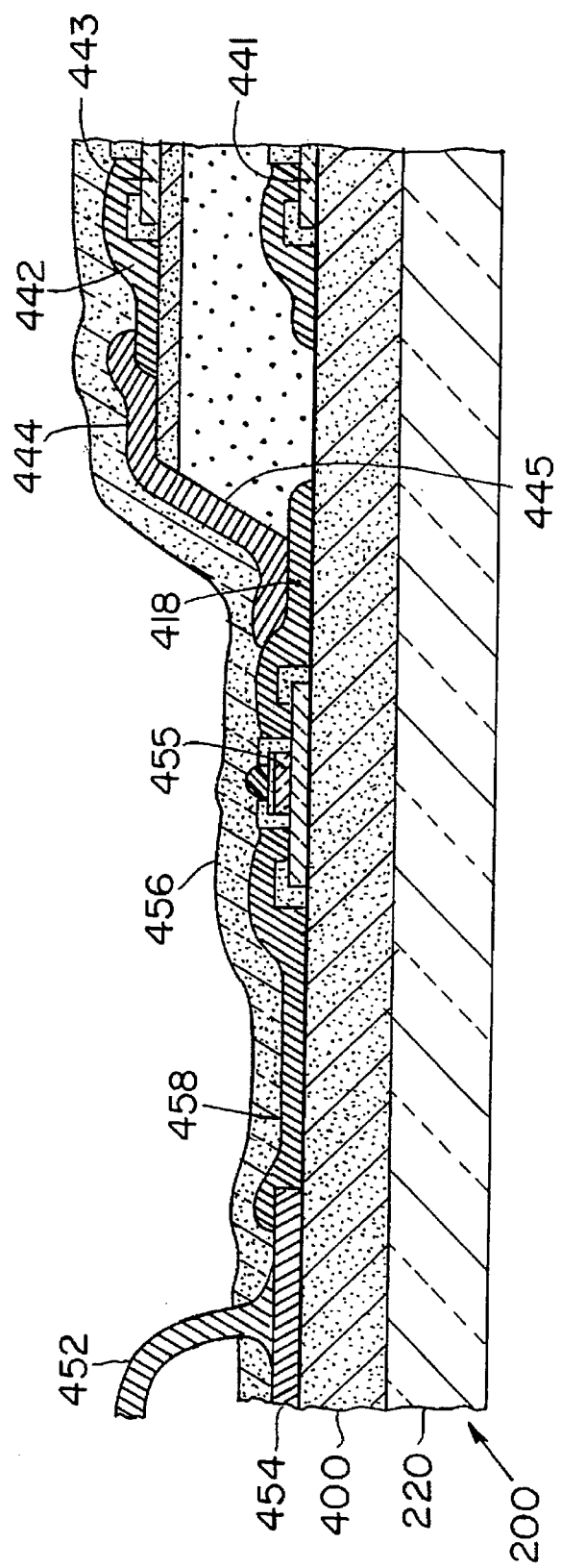
FIG. 4D is a cross-sectional view of an external interconnect.

Another method of connecting the different layers is the external interconnect of FIG. 4D. In this embodiment vertical interconnect 444 extends along the outer sidewall 445 of the multi-layered structure. In this particular example upper circuit element 443 is connected by metalization elements 442, 444 and 418 with a circuit element 455 on the lower layer of the device. Circuit element 455 is connected to the chip carrier through wire bond 452 at bond pad 454 and metalization line or bus 458. Note that circuit element 455 is not covered in this embodiment by an overlying circuit structure. A passivation layer 456 is shown covering circuit elements 455 and 443 and the related interconnects. Covered circuit element 441 can also be connected to upper circuit element 443 through this external interconnect 444. Note further that the circuit routing layers illustrated in FIGS. 9A, 9B and 15 can also use external interconnects. These external interconnects can be used in both double or single transfer structures and can be used in structures having three or more layers in a cascade structure.

Figure 5A:
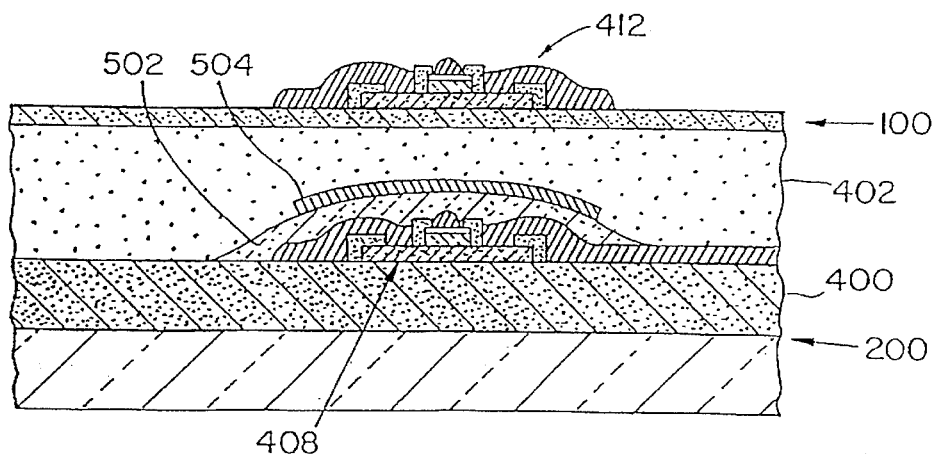
FIG. 5A is a cross-sectional view of multi-layer shielding using a grounded metal run patterned over an insulating layer.

FIG. 5A presents a cross-sectional view of multi-layer shielding. An insulating layer 502 is applied over transistor 408 before the epoxy 402 is applied. A conducting metal layer 504 is patterned over the insulating layer 502 to provide for a shielding path. This path shields transistor 408 on the first layer 200 from transistor 412 on the second layer 100, reducing the threat of problems associated with thermal degradation, cross-talk, and electro-magnetic interference.

Figure 5B:
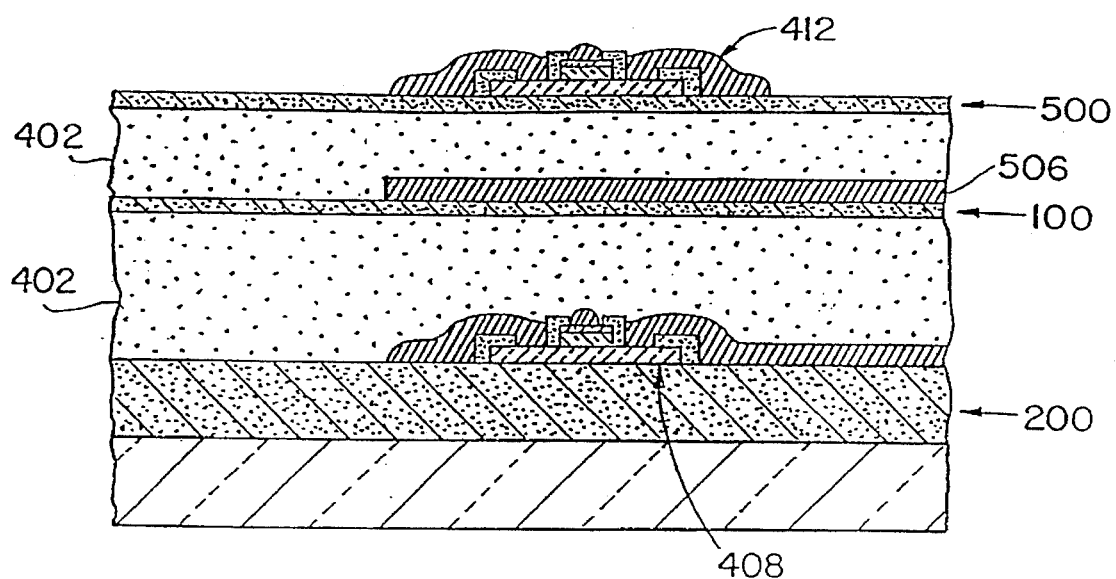
FIG. 5B is a cross-sectional view of multi-layer shielding using a metal run patterned on a separate shielding layer.

Another method of shielding is shown in FIG. 5B. The first layer 200 is shielded from the third layer 500 by an electrically conductive second layer 100. A metal layer 506 is patterned on the second layer 100, shielding transistor 408 on the first layer 200 from transistor 412 on the third layer 500. The conductive second layer 100 is aligned and epoxied over the first layer 200 and after the epoxy cures, the third layer 500 is aligned and epoxied over the second layer 100. A double transfer process is shown, but a single transfer process may be used as well. Depending on the application, power or ground would be applied to the electrically shielding layer.

Figure 6:
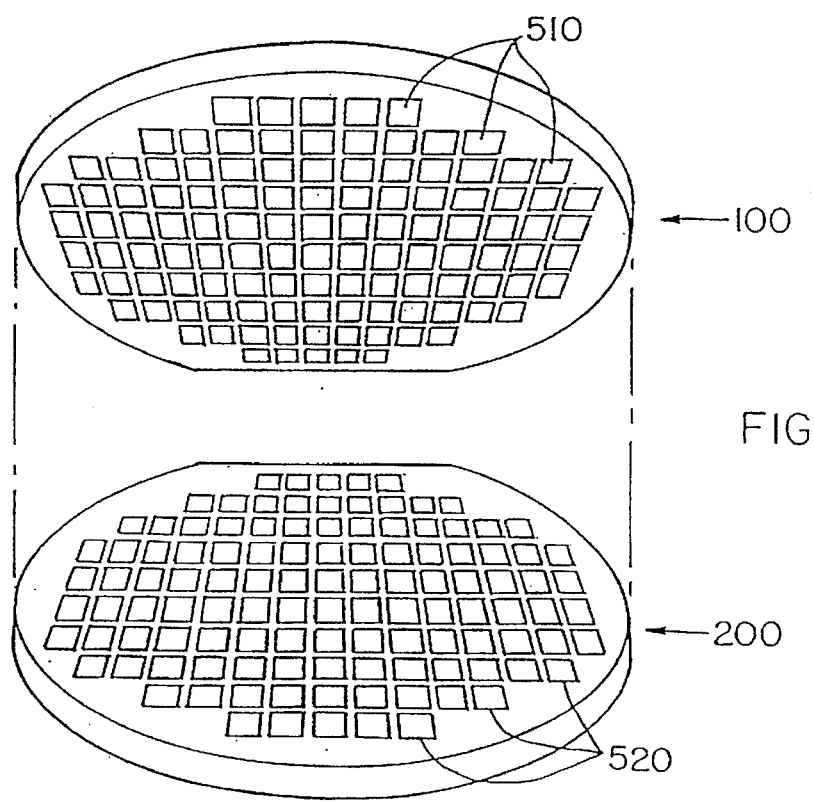
FIG. 6 is an exploded view of two film layers, each with a multitude of individual dies, being layered together using the single transfer process.

FIG. 6 shows a first 200 and second 100 wafer being aligned in a single transfer process. The first wafer 200 comprises an array of individual circuit elements 520, which are to be electrically connected to the array of circuit elements 510 on the second wafer 100.

Figure 7:
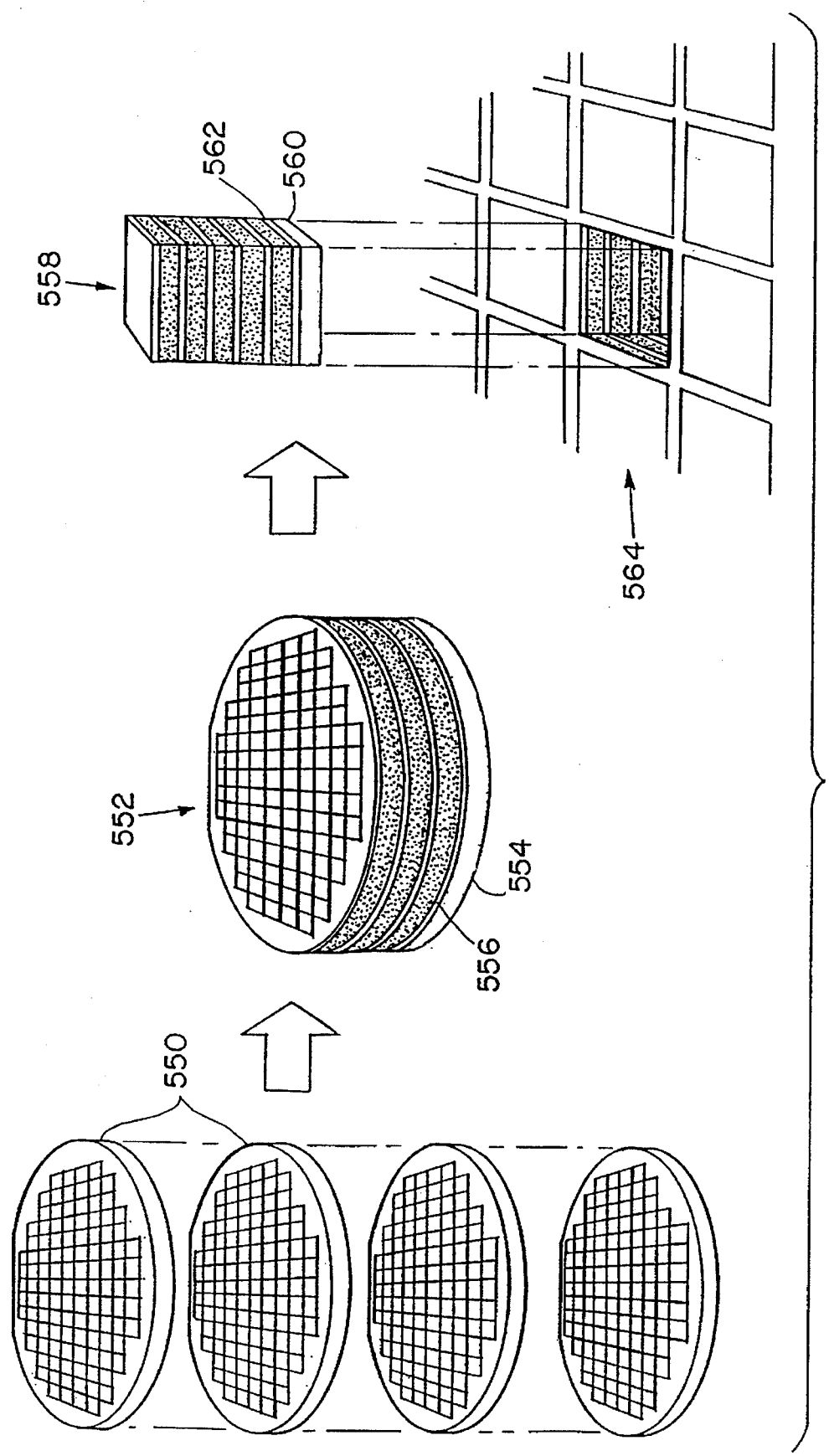
FIG. 7 is a progressional view of layers of film being aligned and epoxied together using the double transfer process, followed by the singulation of an individual multi-layered microprocessor.

FIG. 7 is a progressional flow diagram of the layering process. The wafer film is first removed from the wafer substrate. Layer by layer, each film is aligned, epoxied, and electrically connected to the film below it, resulting in a stack 552 of alternating epoxy 554 and thin film 556 layers. An individual multi-layered circuit 558 is then removed from the array 564, processed further, and then packaged.

Figure 8:
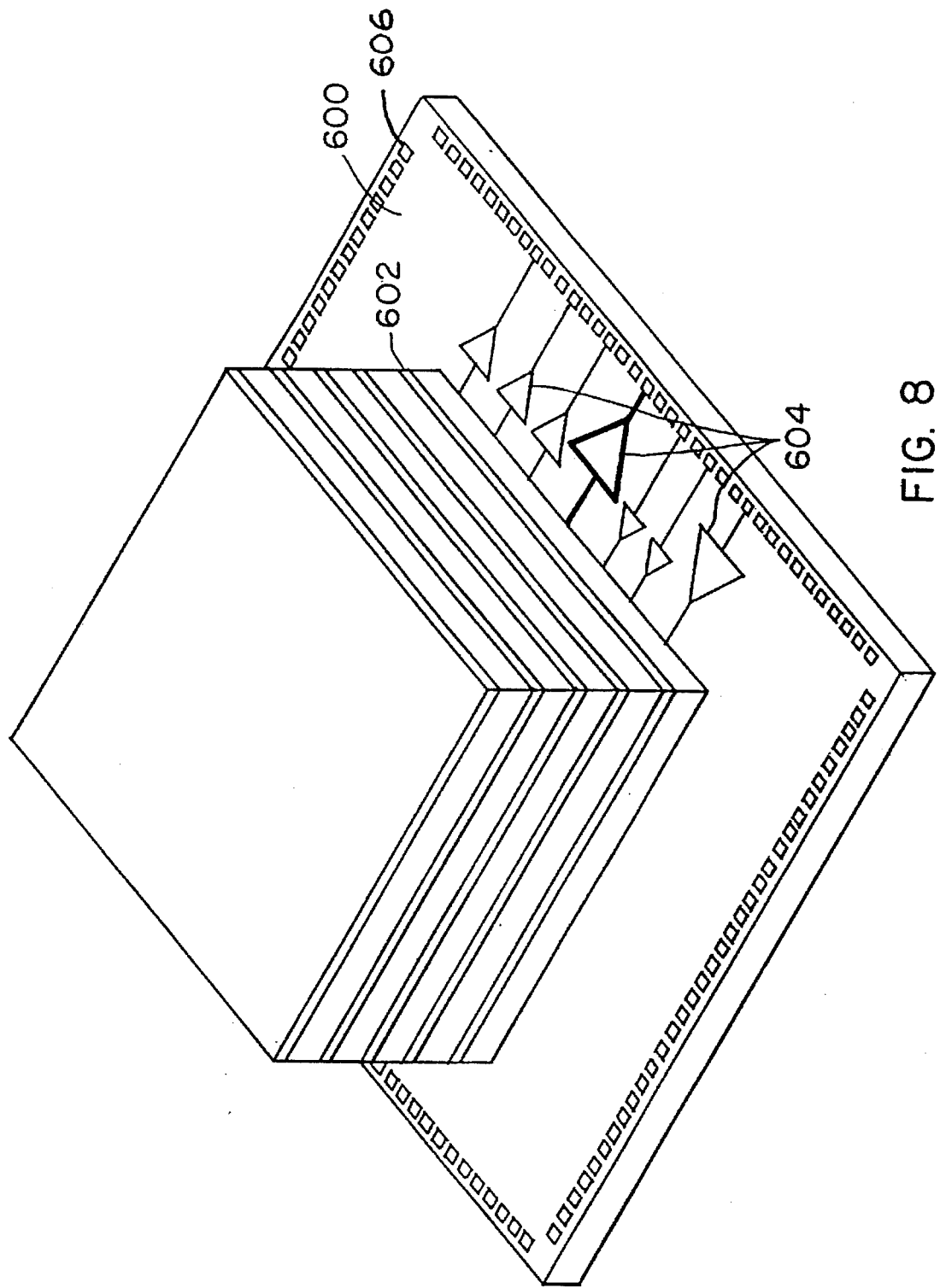
FIG. 8 is a perspective view of a completed multi-layer microprocessor, with components which produce the most heat fabricated around the outer perimeter of the first layer.

A completed multi-layer configuration is shown in FIG. 8. Note that the first layer 600 may be really larger than the second layer 602, to provide for access to the bonding pads 606. Components which generate large amounts of heat such as buffer-drivers 604, may be fabricated around the perimeter of the first layer 600 so that the heat generated by such components may be drawn from the chip in a more efficient manner.

Figure 9A:
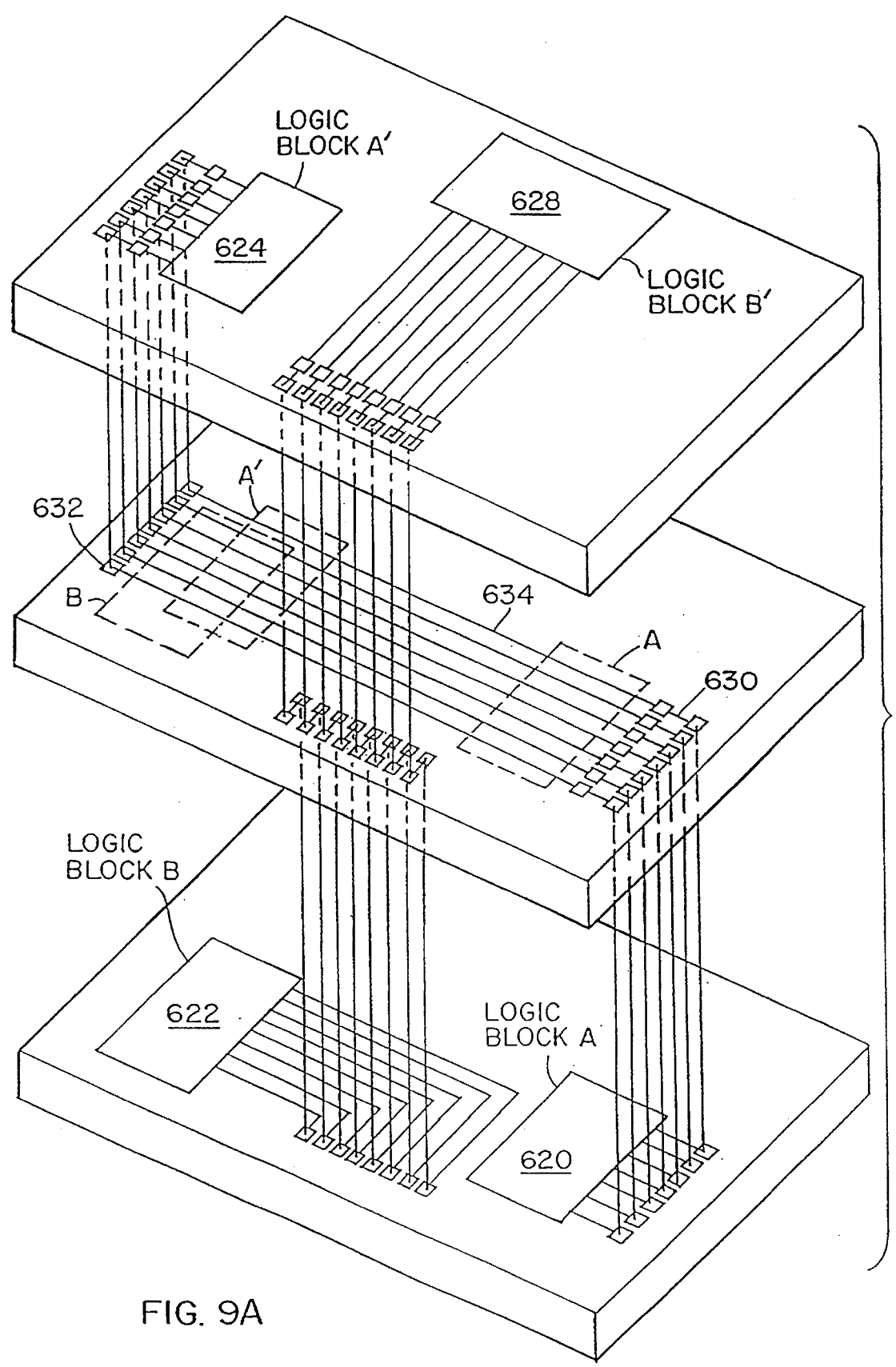
FIG. 9A is an exploded perspective view demonstrating how an intermediate layer may be used for routing signals on multiple layers which otherwise would cross on a single layer.

FIG. 9A is an exploded perspective view demonstrating how an intermediate layer may provide additional circuit routing resources in connecting logic blocks located on different layers. Logic block A 620 on the first layer is to be connected to logic block A' 624 on the third layer. Logic block B 622 on the first layer is to be connected to logic block B' 628 on the third layer. If all four logic blocks were to be fabricated on the same layer using single layer technology, the route would be very complicated. First the logic blocks themselves could not be superimposed upon one another, and second, the interconnect lines are not permitted to cross on single layer technology. With an additional routing layer available, the interconnect lines may cross on separate layers and the logic blocks may be superimposed over one another on separate layers. Logic block A 620 is routed up to the second layer by the use of inter-layer connector 630, and interconnect line 634 is routed over the top of logic block A and under logic block A' to inter-layer connector 632, up to logic block A' 624. The lines coming out of logic block B 622 are routed up to the second layer by the use of an inter-layer connector. The interconnect line jogs over and up to the third layer again by the use of an inter-layer connector over the lines connecting A and A' to logic block B' 628. The use of an intermediate routing layer provides interconnect between logic blocks on separate layers while reducing the space consumed by complicated routing patterns.

Figure 9B:
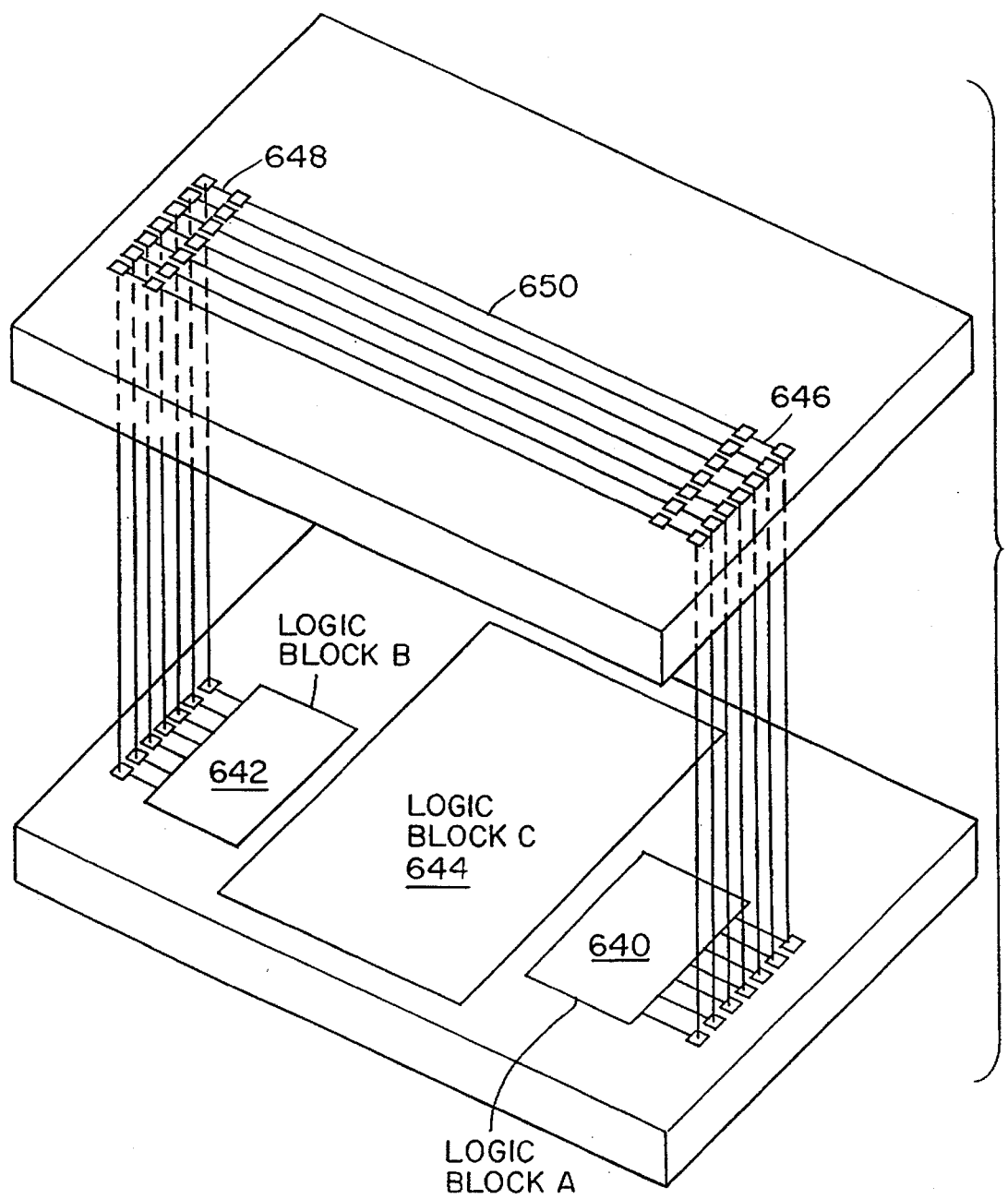
FIG. 9B is an exploded perspective view demonstrating how an upper layer may be used for routing signals for a lower layer.

FIG. 9B shows how an additional routing layer may be used in connecting two logic blocks fabricated on the same layer. Logic block A 640 is to communicate with logic block B 642 on the same layer, but blocks A 640 and B 642 are separated by logic block C 644. In the single layer context, the signals would have to be routed around logic block C 644. In a multi-layer context, the signal could be routed from A 640 up to the second layer by the use of an inter-layer connector 646 continuing directly over logic block C 650 over to inter-layer connector 648, back down to logic block B 642.

An individual logic block may be fabricated on several layers, with inter-layer connectors providing for interconnect between the subcomponents of the logic block. For example, an eight bit shift register, instead of being fabricated on a single layer, could be fabricated so that it is partitioned onto eight layers, with one bit on each layer, or it could be partitioned onto four layers, with two bits on each layer. This affords greater flexibility in placing the logic blocks and frees up space for inter-connect routing.

Figure 10:
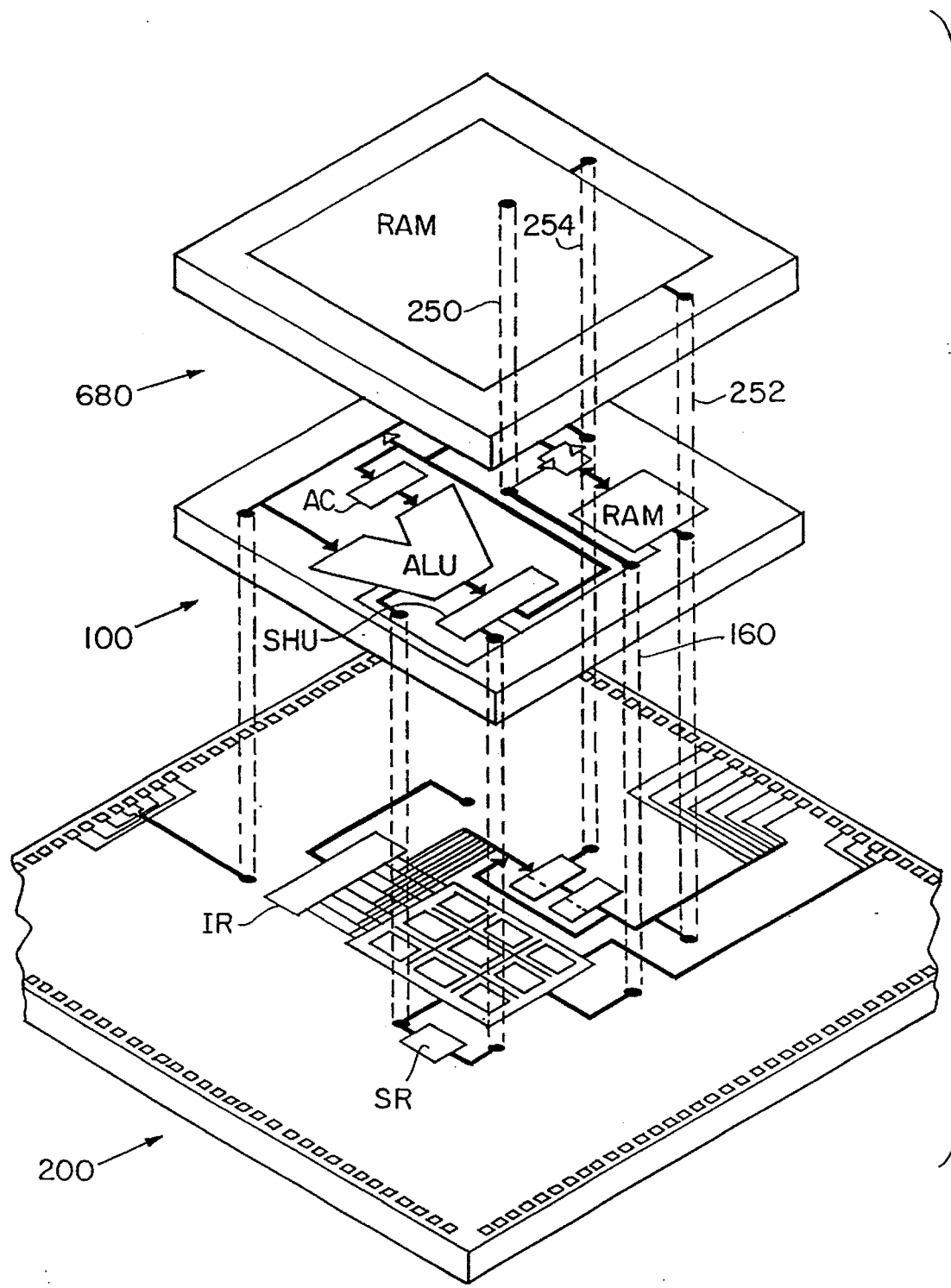
FIG. 10 is an exploded perspective view of a multi-layer microprocessor having an additional layer of random access memory.

As shown in FIG. 10, an additional layer or several layers of random access memory may be stacked on top of the multi-layer microprocessor. The address bus 252, data bus 254, and control bus 250 are routed up to the random access memory by the use of inter-layer connectors. This configuration results in reduced memory access time, increasing the speed of the entire system.

Figure 11:
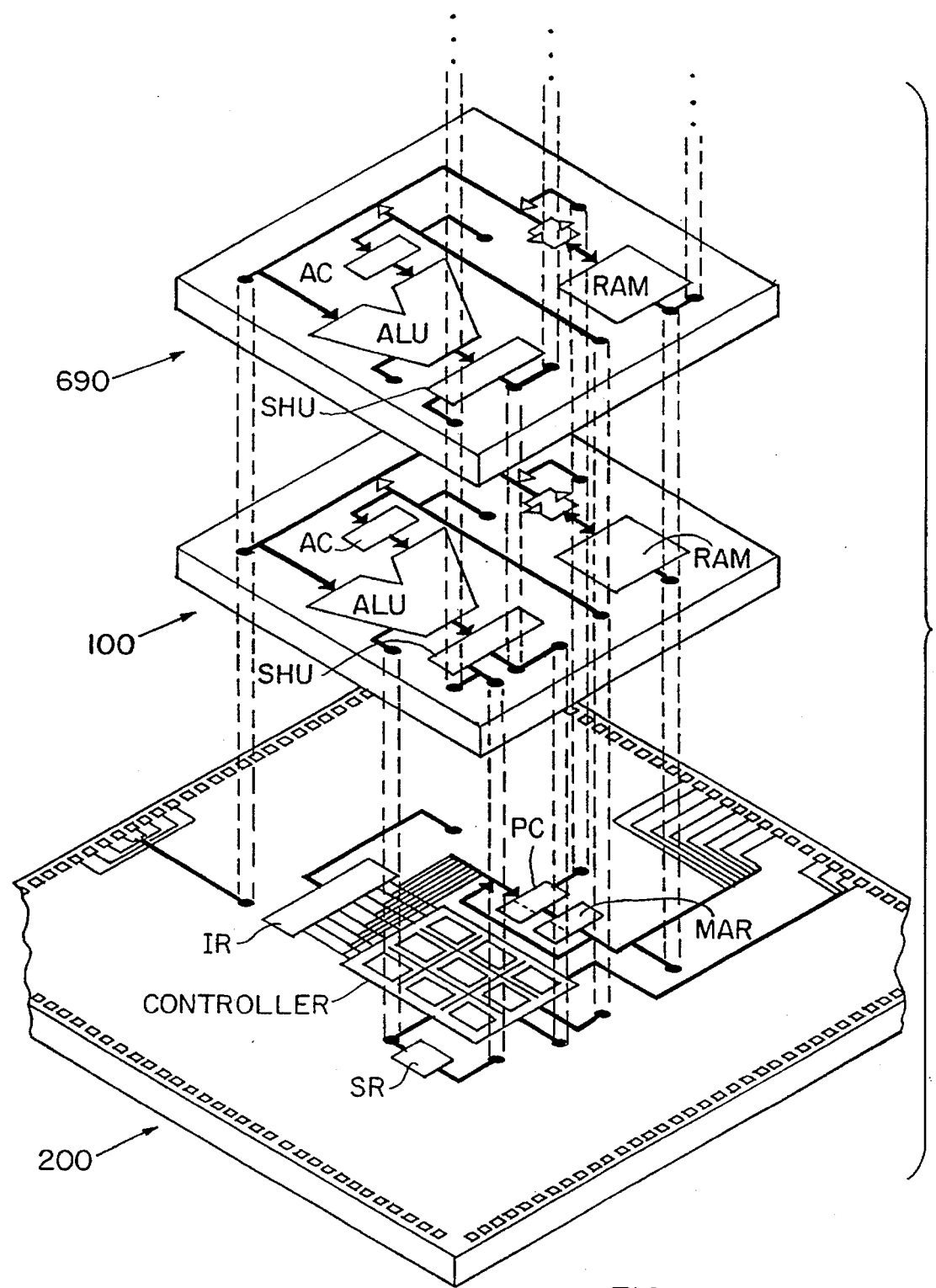
FIG. 11 is an exploded perspective view of a multi-layered bit-sliced microprocessor.

The multi-layered microprocessor may also be configured in a bit slice format, as shown in FIG. 11. A bit-slice controller is fabricated on the first layer 200. The second layer 100 comprises the least significant bits of the data bus and its supporting logic. Each additional layer 690, adds to the width of the data bus. For example, if the second layer 100 comprised four data bits and each additional layer was similar to the second layer 100, then each additional layer 690 would widen the data bus by four bits, two layers would provide for an eight bit machine, three layers would provide for a twelve bit machine and so on.

Figure 12:
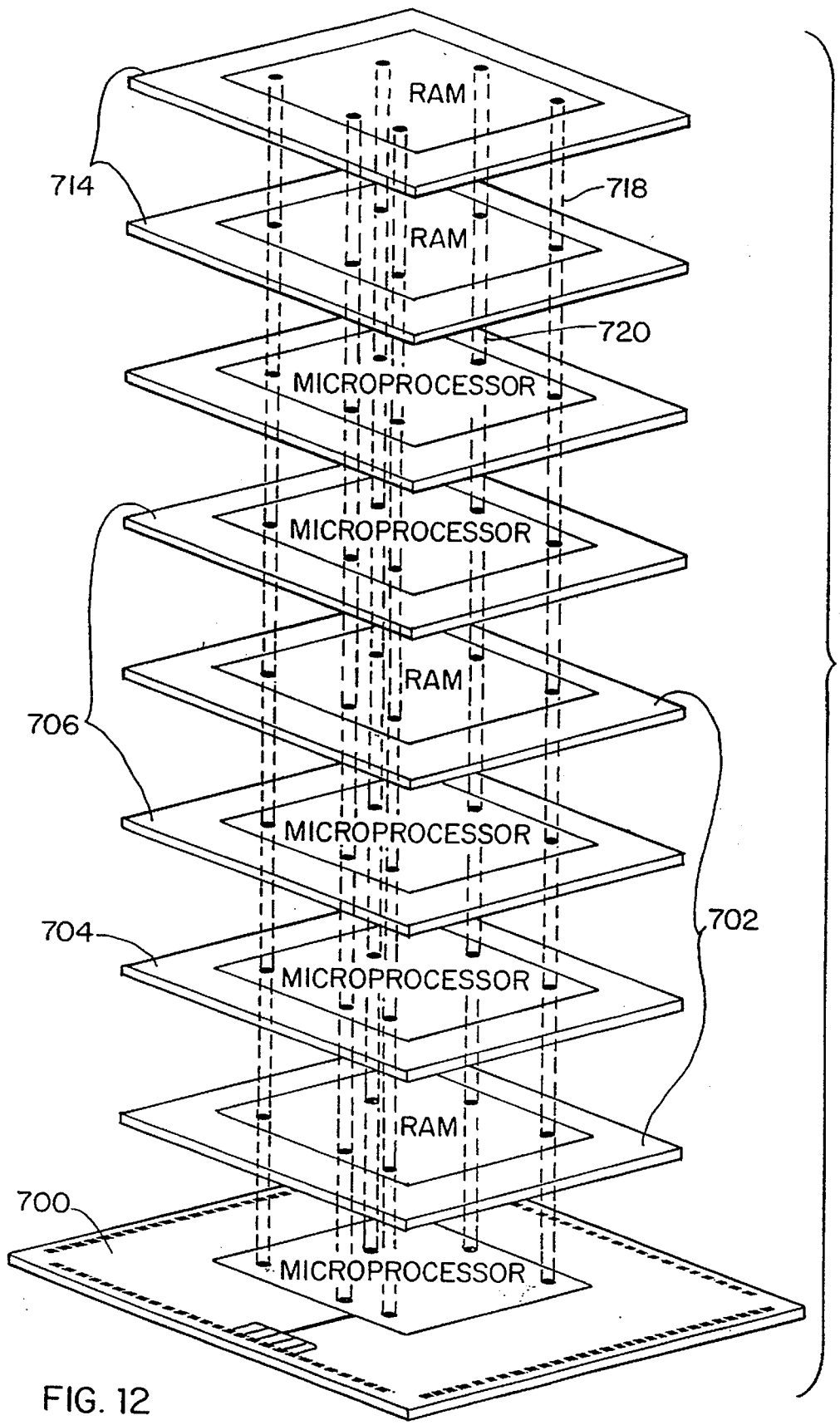
FIG. 12 is an exploded perspective view of a layered multi-processor system.

This technology is also useful in the multiprocessor environment. FIG. 12 presents a stacked microprocessor and random access memory array which is one potential multi-processor embodiment used in parallel processing applications. The first layer 700 is a microprocessor which shares random access memory 702 on the second layer, which another microprocessor 704 located above the random access memory. Above that microprocessor 704, an additional pair of microprocessors 706 share random access memory located between them 702. Additional random access memory 714 may be used for global storage, access provided for all microprocessors by a common data bus 718 and a common address bus 720. The address 720, and data 718 buses run vertically through the stack by the use of inter-layer connectors. This configuration lends itself well to use in signal processing applications.

Figure 13:
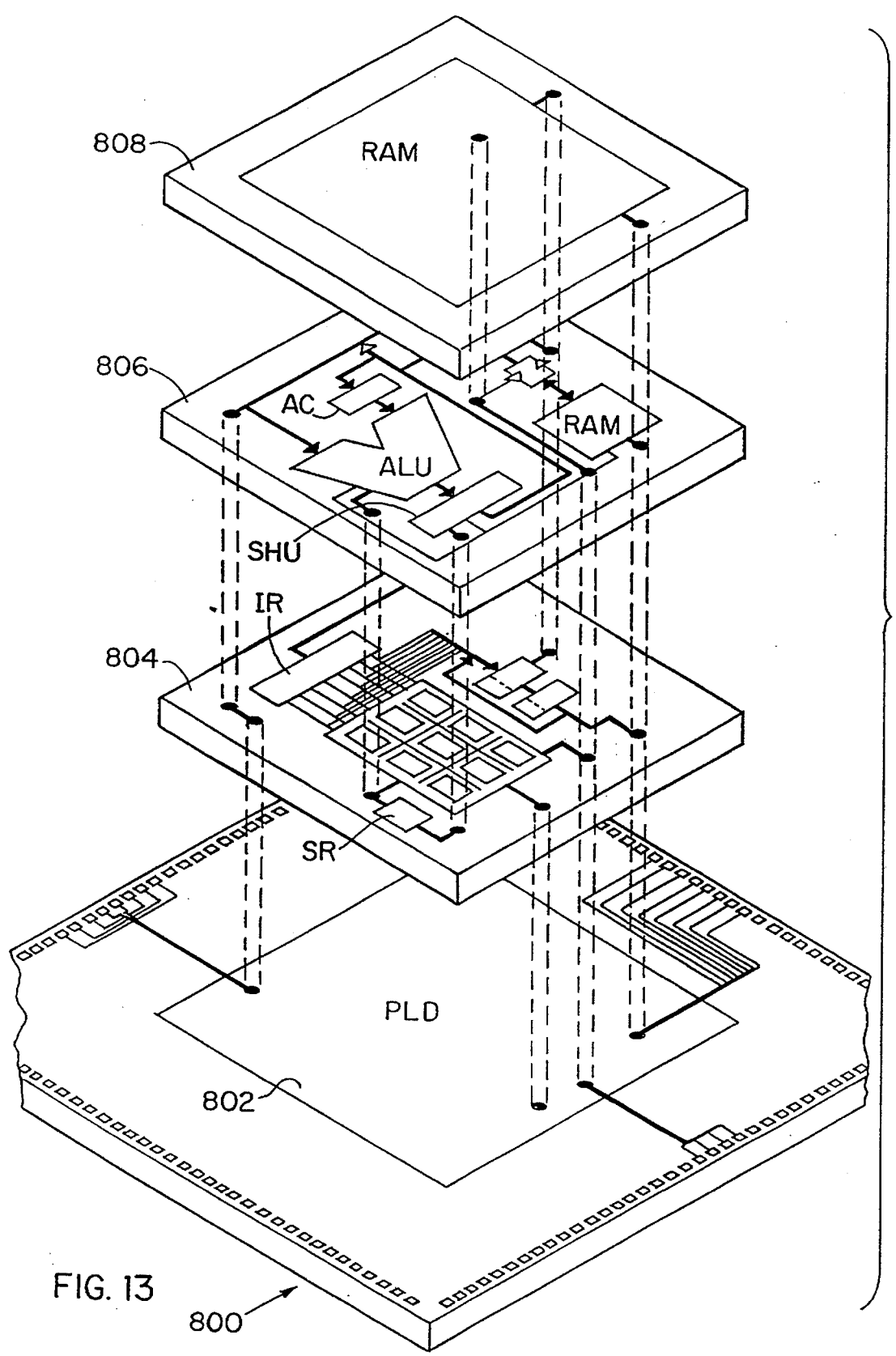
FIG. 13 is an exploded perspective view of a multi-layer microprocessor, with random access memory on an upper layer and a programmable logic device on the lower layer.

Programmable logic arrays can be used to provide communication between a multi-layered microprocessor and the outside world. In FIG. 13, a programmable logic array 802 is fabricated upon the first layer 800. The second 804 and third 806 layers comprise a multi-layer microprocessor, with random access memory on the fourth layer 808. The programmable logic layer 802 can be programmed to provide for user-defined communication protocol between the microprocessor and any off-chip resources. The array 802 can be formed in any of the layers of a multilayer structure as described elsewhere herein.

Figure 14:
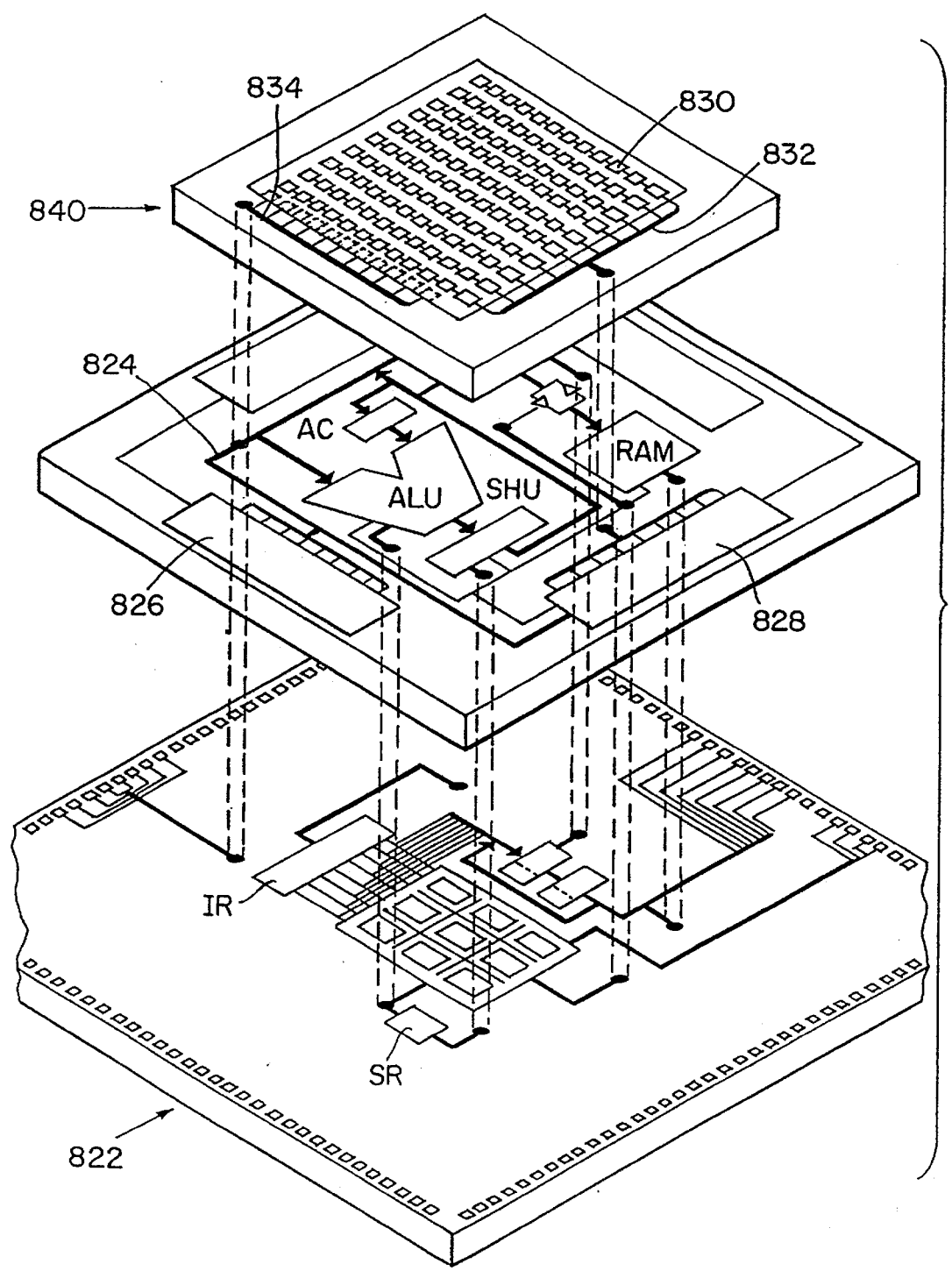
FIG. 14 is an exploded perspective view of a multi-layered microprocessor with a light emitting diode array on the upper layer.

As shown in FIG. 14, a light-emitting diode array may be mounted as the top layer in a multi-layer configuration. The x-axis driver circuitry 826 is fabricated on the second layer and is connected to the LED array by the use of inter-layer connector 834. The y-axis driver circuitry 828 in the same way is connected to the LED array layer 840 by inter-layer connector 832. The driver circuits receive information to be displayed from the data bus 824. In preferred embodiments these LED elements or arrays can be used to form integrated displays or alternatively can be used along with fiber optics to optically interconnect different layers of the structure. The fabrication of bulk or thin film III–V semiconductor materials which are transferred to form LED elements, arrays and circuit elements is described in greater detail in U.S. Ser. No. 07/643,552 filed on Jan. 18, 1991 now U.S. Pat. No. 5,300,788 which is incorporated herein by reference. The formation of composite structures including GaAs on silicon structures is also described in the above-referenced incorporated application.

Film segments may be arranged side by side on top of a single layer. In FIG. 15, segments 902 and 904 are layered over segment 900. The segments can communicate directly by the use of a metallization path 910 etched directly over the epoxy layer, or they may communicate by the use of inter-layer connectors 908. Another segment 906 may bridge the segments 902 and 904 with inter-layer connectors 912 providing communication between the upper and lower segments.

The memory circuits and logic circuits may be formed and transferred by a number of processes including transfer of two or more layers onto a single substrate as shown in FIG. 15. The basic steps in such a single transfer process are: forming of a plurality of thin film Si circuits on Si substrates, dicing the thin film to form tiles, and transferring the tiles to a common module substrate by "tiling." Tiling involves the steps of transferring, registering the transferred tiles, and adhering the registered tiles. The Si substrates are then removed and the circuits on the tiles are interconnected.

The double transfer approach, described in detail in connection with FIG. 4C is similar except that the Si-substrate is removed after dicing and the thin film is transferred to an intermediate transfer body or carrier before ultimate transfer to the common module body.

Note that an optional release layer with a different etch rate can be used in the transfer process. For example, a silicon oxy-nitride release layer, comprising a mixture of silicon nitride ($S_3N_4$) and silicon dioxide ($SiO_2$) may be a suitable choice. Such a layer etches more slowly in hydrofluoric acid than does $SiO_2$ alone. This etch rate can be controlled by adjusting the ratio of N and O in the silicon oxy-nitride ($SiO_xN_y$) compound.

A thin essentially single crystal layer of silicon is then formed over the release layer. The oxide (or insulator) is thus buried beneath the Si surface layer. For the case of ISE SOI structures, the top layer is essentially single-crystal recrystallized silicon, from which CMOS circuits are be fabricated.

Note that for the purposes of the present application, the term "essentially" single crystal means a film in which a majority of crystals show a common crystalline orientation and extend over a cross-sectional area in a plane of the film for at least 0.1 $cm^2$, and preferably, in the range of 0.5–1.0 $cm^2$, or more. The term also includes completely single crystal Si.

After the devices have been processed and the circuit layers tested and repaired, as required, the next step in the process is to transfer the silicon pixel circuit film to a common module, either directly, or by a double transfer from substrate to carrier and then to the common module. A double transfer approach is illustrated and described in greater detail in U.S. Ser. No. 07/874,588 filed on Apr. 24, 1992 now U.S. Pat. No. 5,376,561 which is incorporated herein by reference.

In order to make connections between the layers of circuits, openings or via holes are defined by appropriate etchants in order to expose contact areas on the two circuit layers. All of the oxide is etched in buffered HF using photoresist as a mask while the adhesive can be etched in oxygen plasma or by reactive ion etching (RIE) using the previously etched oxide as a mask. When using RIE, the side walls can be made vertical and the holes completely filled. Once these via holes have been opened in the bonding layer, they can be filled with metal in order to make the contact from layer to layer. The layer to layer interconnections are explained in detail elsewhere in the present application. The adhesive layer between the superposed circuits must be kept very thin, a few microns thick for the layer to layer contacting to be possible. The adhesive layer should be between 1 and 50 microns and preferably between 1 and 5 microns. The process can be repeated to add additional layers to the device.

The performance characteristics of each circuit in a three-dimensional structure are related to the conductivity of the medium in which the circuit is disposed. Circuits prepared using the present methods demonstrate that the transconductance and the drive current are higher when the circuit is buried under epoxy than when it is exposed to ambient air. This effect can be explained by the 5.4 times higher thermal conductivity of the epoxy with respect to air which results in a reduced heating effect for the circuit buried in epoxy. It is noted that carrier mobility decreases as the temperature of the circuit increases and that performance is directly related to carrier mobility. Thus, surrounding circuits in highly conductive epoxies provide lower device temperatures leading to improved performance characteristics. Table I compares the thermal conductivities of a few of the many different materials that can be used:

TABLE I

| Material | $\lambda(W)$ $(m^{-1})$ $(°K.^{-1})$ |
|---|---|
| Si | 150 |
| $SiO_2$ | 1.4 |
| Air* | 0.024 |
| EP112 | 0.13 |

*Not including free convection

There are many available thermally conductive/ electrically insulating epoxies. Castall, Tracon, Masterbond, and Epotek all make a number of versions of heat conductive epoxies. The highest conductivities are achieved by filling an epoxy resin with various materials including alumina and aluminum nitride. Hitachi also makes a diamond filled epoxy. All the alumina and aluminum nitride filled epoxies are opaque due to the conductive particles used as fillers. They can be cured at room temperature or at elevated temperatures. The aluminum nitride filled epoxies have thermal conductivities of ~3.6 $(W^{-1})$ $(m^{-1})$ $(°K^{-1})$. Aluminum oxide filled epoxies are in the 1.44–21.6 range. Diamond filled epoxies are the best of all. These filled epoxies can be made to accommodate temperatures up to 250° C. The aluminum nitride particle size is 5 µm or greater. Aluminum oxide particle size can be made much smaller so thinner bondlines are possible. Some trade names are Masterbond EP21, Supreme 10, Tracon 2151, Castall E340 series, Epotek H62, H70E. Also, silicon carbide filled epoxies can be used.

It is noted that the filled epoxies sampled are generally viscous, opaque pastes such that it may be difficult to obtain very thin (<5 µm) bondlines. Medium thermal conductance in the 0.85–1.44 (W) $(m^{-1})$ $(°K^{-1})$ range can be achieved without fillers. These epoxies are of slightly lower viscosity, can be put on thinner and are preferable if the conductance is high enough. Another option is to coat the devices with a thin diamond like film or a conductive ceramic like aluminum nitride to facilitate heat removal. This decreases the thermal conductance criteria for the epoxy, allowing the use of a lower viscosity epoxy in order to achieve the thin bondlines necessary for layer to layer interconnections.

One significant aspect in the formation of three-dimensional circuits involves interconnecting the layered devices. It is noted that in such circuits, the epoxy disposed between the device layers may be spun to obtain a thickness of a few microns. Alternatively, other known techniques can be employed to obtain a thin, uniform layers of epoxy. Via holes are formed through the upper contact areas to gain access to the lower contact areas. The etching to form the via holes with high aspect ratio is performed by an RIE technique. Electrical contact between the upper and lower devices is made by filling the via holes 1022 with an electrically conductive material such as tungsten or aluminum.

Another significant aspect of three-dimensional circuits involves shielding device layers to avoid undesirable electrical interference between devices. Ground planes are positioned between device layers and to prevent electrical interference. These conductive ground planes can be made with a metal or by ITO deposition on the surface of the oxide layer 1032 opposite the device.

We claim:

1. A method of fabricating a data processor comprising:
    forming a first circuit of a data processor in a first layer of semiconductor material;
    forming a second circuit of a data processor in a second layer of semiconductor material;
    bonding the second layer to the first layer with a bonding layer;
    forming an opening in the bonding layer for an interconnect; and
    connecting the first data processor circuit with the second data processor circuit with an interconnect extending through the bonding layer opening such that data processor signals can be conducted between the first data processor circuit and the second data processor circuit.

2. The method of claim 1 further comprising forming a controller in the first circuit or the second circuit.

3. The method of claim 1 further comprising forming a memory in the first circuit or the second circuit.

4. The method of claim 1 further comprising bonding the first circuit layer to the second circuit layer with a polymeric adhesive.

5. The method of claim 1 further comprising forming the second circuit in a thin film semiconductor layer on an insulating substrate.

6. The method of claim 5 further comprising transferring the thin film semiconductor layer and attached insulating layer onto the first layer of semiconductor layer.

7. The method of claim 1 wherein the first layer of semiconductor material comprises a bulk semiconductor wafer.

8. The method of claim 1 wherein the first circuit layer or the second circuit layer comprises silicon.

9. The method of claim 1 wherein the first circuit layer or the second circuit layer comprises a III–V material.

10. The method of claim 1 further comprising forming a third circuit layer over the second circuit layer.

11. The method of claim 1 further comprising forming a plurality of additional circuit layers over the first and second circuit layers.

12. A method of fabricating a data processor comprising:
    forming a first circuit of a data processor in a first layer of semiconductor material;
    forming a light emitting device in a second layer of semiconductor material;
    bonding the second layer to the first layer with a bonding layer;
    forming an opening in the bonding layer for an interconnect; and
    connecting the first data processor circuit with the light emitting device with an interconnect extending through the bonding layer opening such that data processor signals can be conducted between the first data processor circuit and the light emitting device.

13. The method of claim 12 further comprising forming a controller in the first circuit.

14. The method of claim 12 further comprising forming a memory in the first circuit.

15. The method of claim 12 further comprising bonding the first circuit layer to the second layer with a polymeric adhesive.

16. The method of claim 12 further comprising forming the light emitting device in a thin film semiconductor layer on an insulating substrate.

17. The method of claim 12 further comprising transferring the thin film semiconductor layer and attached insulating layer onto the first layer of semiconductor layer.

18. The method of claim 12 wherein the first layer of semiconductor material comprises a bulk semiconductor wafer.

19. The method of claim 12 wherein the first circuit layer comprises silicon.

20. The method of claim 12 wherein the first circuit layer or the second circuit layer comprises a III–V material.

21. A method of fabricating a data processor comprising:
    forming a first circuit of a data processor in a first layer of semiconductor material;
    forming a circuit routing layer and bonding the circuit routing layer to the first circuit layer;
    forming a second circuit of a data processor in a second layer of semiconductor material;
    bonding the second layer to the circuit routing layer with a bonding layer;
    forming an opening in the bonding layer for an interconnect; and
    connecting the first data processor circuit with the second data processor circuit with an interconnect extending through the bonding layer opening and along the circuit routing layer such that data processor signals can be conducted between the first data processor circuit and the second data processor circuit.

22. The method of claim 21 further comprising forming a controller in the first circuit or the second circuit.

23. The method of claim 21 further comprising forming a memory in the first circuit or the second circuit.

24. The method of claim 21 further comprising bonding the first circuit layer to the second circuit layer with a polymeric adhesive.

25. The method of claim 21 further comprising tiling a plurality of second circuit layers over the circuit routing layer.

26. The method of claim 12 further comprising transferring the second layer to the first layer with a single transfer process.

27. The method of claim 12, further comprising transferring the second layer to the first layer with a double transfer process.

28. The method of claim 12 further comprising forming the layers with a silicon-on-insulator (SOI) film.

29. The method of claim 1 further comprising transferring the second layer to the first layer with a single transfer process.

30. The method of claim 1 further comprising transferring the second layer to the first layer with a double transfer process.

31. The method of claim 1 further comprising forming the layers with a silicon-on-insulator (SOI) film.

32. A method of fabricating a data processor comprising:
    forming a first circuit of a data processor in a first layer of semiconductor material;
    forming a second circuit of a data processor in a second layer of semiconductor material;
    bonding the second layer to the first layer with a bonding layer;
    curing said bonding layer;
    forming a hole through the bonding layer; and applying a metallization layer for electrically connecting the first circuit and the second circuit, the metallization layer flowing from the second layer through the hole to the first layer.

33. The method of claim 32 further comprising forming the layers with a silicon-on-insulator (SOI) film.

34. The method of claim 32 wherein the first circuit layer or the second circuit layer comprises silicon.

35. The method of claim 32 wherein the first circuit layer or the second circuit layer comprises a III–V material.

36. The method of claim 32 further comprising forming a plurality of additional circuit layers over the first and second circuit layers.

37. The method of claim 32 further comprising tiling a plurality of second circuit layers over the circuit routing layer.

38. The method of claim 32 further comprising forming the second circuit in a thin film semiconductor layer on an insulating substrate.

39. The method of claim 32 further comprising forming a plurality of additional circuit layers between the first and second circuit layers.

40. A method of fabricating a data processor, comprising:

forming a first circuit having a first data processor circuit in a first silicon layer of a first silicon-on-insulator structure;

forming a second circuit having a second data processor circuit in a second silicon layer of a second silicon-on-insulator structure;

bonding the second layer to the first layer with a bonding layer;

forming openings in the bonding layer for interconnects; and thereafter connecting the first data processor circuit with the second data processor circuit with interconnects extending through the openings in the bonding layer to enable communication of data processor signals between the first data processor circuit and the second data processor circuit.

41. The method of claim 40 wherein the first circuit layer or the second circuit layer comprises silicon.

42. The method of claim 40 wherein the first circuit layer or the second circuit layer comprises a III–V material.

43. The method of claim 40 further comprising forming a plurality of additional circuit layers over the first and second circuit layers.

44. The method of claim 40 further comprising forming the second circuit in a thin film semiconductor layer on an insulating substrate.

45. The method of claim 40 further comprising forming a plurality of additional circuit layers between the first and second circuit layers.

46. A method of fabricating a data processor, comprising:

forming a first circuit of a data processor in a first layer of semiconductor material;

forming a second circuit of a data processor in a second layer of semiconductor material on a substrate;

bonding the second layer to the first layer with a bonding layer;

removing the substrate from the second layer;

forming an opening in the bonding layer for an interconnect; and connecting the first data processor circuit with the second data processor circuit with an interconnect extending through the bonding layer opening such that data processor signals can be conducted between the first data processor circuit and the second data processor circuit.

47. The method of claim 46 further comprising forming the layers with a silicon-on-insulator (SOI) film.

48. The method of claim 46 wherein the first circuit layer or the second circuit layer comprises silicon.

49. The method of claim 46 wherein the first circuit layer or the second circuit layer comprises a III–V material.

50. The method of claim 46 further comprising forming a plurality of additional circuit layers over the first and second circuit layers.

51. The method of claim 46 further comprising tiling a plurality of second circuit layers over the circuit routing layer.

52. The method of claim 46 further comprising forming the second circuit in a thin film semiconductor layer on an insulating substrate.

53. The method of claim 46 further comprising forming a plurality of additional circuit layers between the first and second circuit layers.

54. A method of fabricating a data processor, comprising:

forming a first circuit of a data processor in a first layer of semiconductor material;

forming a second circuit of a data processor in a second layer of semiconductor material on a substrate;

transferring the second layer to a transfer body;

removing the substrate from the second layer;

bonding the second layer to the first layer with a bonding layer;

removing the transfer body from the second layer;

forming an opening in the bonding layer for an interconnect; and connecting the first data processor circuit with the second data processor circuit with an interconnect extending through the bonding layer opening such that data processor signals can be conducted between the first data processor circuit and the second data processor circuit.

55. The method of claim 54 further comprising forming the layers with a silicon-on-insulator (SOI) film.

56. The method of claim 54 wherein the first circuit layer or the second circuit layer comprises silicon.

57. The method of claim 54 wherein the first circuit layer or the second circuit layer comprises a III–V material.

58. The method of claim 54 further comprising forming a plurality of additional circuit layers over the first and second circuit layers.

59. The method of claim 54 further comprising tiling a plurality of second circuit layers over the circuit routing layer.

60. The method of claim 54 further comprising forming the second circuit in a thin film semiconductor layer on an insulating substrate.

61. The method of claim 54 further comprising forming a plurality of additional circuit layers between the first and second circuit layers.

62. The method of claim 12 further comprising forming a third circuit layer over the second circuit layer.

63. The method of claim 12 further comprising forming a plurality of additional circuit layers between the first and second circuit layers.

* * * * *